US011005426B2

United States Patent
Kim et al.

(10) Patent No.: US 11,005,426 B2
(45) Date of Patent: May 11, 2021

(54) RADIO FREQUENCY (RF) INTEGRATED CIRCUIT PERFORMING SIGNAL AMPLIFICATION OPERATION TO SUPPORT CARRIER AGGREGATION AND RECEIVER INCLUDING THE SAME

(71) Applicant: SAMSUNG ELECTRONICS CO., LTD., Suwon-si (KR)

(72) Inventors: Young-Min Kim, Suwon-si (KR); Jong-Soo Lee, Hwaseong-si (KR); Jong-Woo Lee, Seoul (KR); Joong-Ho Lee, Suwon-si (KR); Ji-Young Lee, Seoul (KR); Pil-Sung Jang, Uijeongbu-si (KR); Thomas Byunghak Cho, Seongnam-si (KR); Tae-Hwan Jin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/289,871

(22) Filed: Mar. 1, 2019

(65) Prior Publication Data
US 2019/0312553 A1    Oct. 10, 2019

(30) Foreign Application Priority Data
Apr. 4, 2018  (KR) .......................... 10-2018-0039334

(51) Int. Cl.
*H03F 1/26*  (2006.01)
*H03F 3/213*  (2006.01)
(Continued)

(52) U.S. Cl.
CPC .............. *H03F 1/26* (2013.01); *H03F 1/223* (2013.01); *H03F 3/213* (2013.01); *H04B 1/16* (2013.01);
(Continued)

(58) Field of Classification Search
CPC . H03F 1/26; H03F 1/223; H03F 3/213; H03F 2200/171; H03F 2200/222;
(Continued)

(56) References Cited

U.S. PATENT DOCUMENTS 7,421,004 B2   9/2008  Feher
8,774,334 B2   7/2014  Fernando
(Continued)

FOREIGN PATENT DOCUMENTS

WO    2015183843    12/2015
WO    2018080711     5/2018

OTHER PUBLICATIONS

European Search Report dated Jul. 8, 2019 in corresponding European Patent Application No. 19166797.1.

*Primary Examiner* — Hieu P Nguyen
(74) *Attorney, Agent, or Firm* — F. Chau & Associates, LLC

(57) ABSTRACT

A receiver includes an amplification block supporting carrier aggregation (CA). The amplification block includes a first amplifier circuit configured to receive a radio frequency (RF) input signal at a block node from an outside source, amplify the RF input signal, and output the amplified RF input signal as a first RF output signal. The first amplifier circuit includes a first amplifier configured to receive the RF input signal through a first input node to amplify the RF input signal, and a first feedback circuit coupled between the first input node and a first internal amplification node of the first amplifier to provide feedback to the first amplifier.

15 Claims, 27 Drawing Sheets

(51) Int. Cl.
*H04B 1/16* (2006.01)
*H03F 1/22* (2006.01)

(52) U.S. Cl.
CPC .. *H03F 2200/171* (2013.01); *H03F 2200/222* (2013.01); *H03F 2200/294* (2013.01); *H03F 2200/451* (2013.01)

(58) Field of Classification Search
CPC ......... H03F 2200/294; H03F 2200/451; H03F 3/193; H03F 1/34; H03F 3/195; H03F 3/245; H04B 1/16; H04B 1/10; H03G 3/3042; H03G 2201/302
USPC ............. 330/291, 310–311, 283, 295, 124 R
See application file for complete search history.

(56) References Cited

U.S. PATENT DOCUMENTS

| | | | |
|---|---|---|---|
| 9,059,665 B2 * | 6/2015 | Youssef | H03F 3/193 |
| 9,154,356 B2 * | 10/2015 | Tasic | H04L 27/2647 |
| 9,154,357 B2 | 10/2015 | Tasic et al. | |
| 9,379,673 B2 * | 6/2016 | Wang | H03F 3/193 |
| 2011/0063035 A1 | 3/2011 | Park et al. | |
| 2013/0051600 A1 | 2/2013 | Mo et al. | |
| 2014/0072001 A1 | 3/2014 | Chang et al. | |
| 2014/0253242 A1 | 9/2014 | Youssef et al. | |
| 2015/0124710 A1 | 5/2015 | Sun et al. | |
| 2015/0280673 A1 | 10/2015 | Tasic et al. | |
| 2016/0204966 A1 | 7/2016 | Kim et al. | |
| 2016/0373065 A1 | 12/2016 | Ko et al. | |
| 2018/0123523 A1 * | 5/2018 | Vujcic | H03F 3/245 |

* cited by examiner

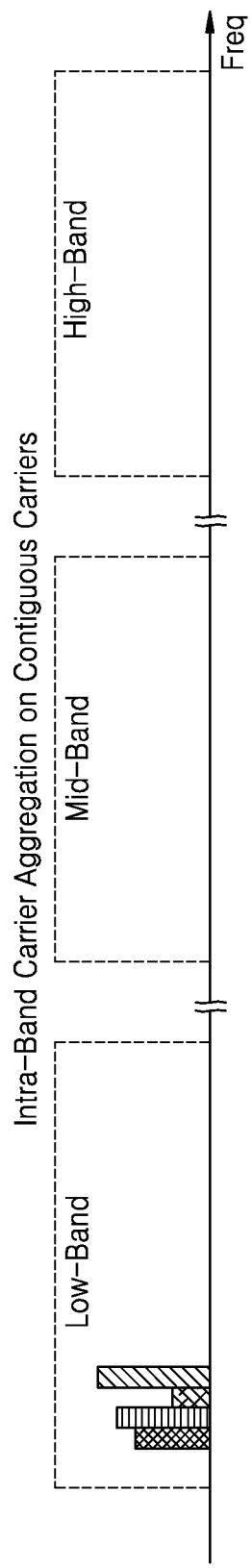

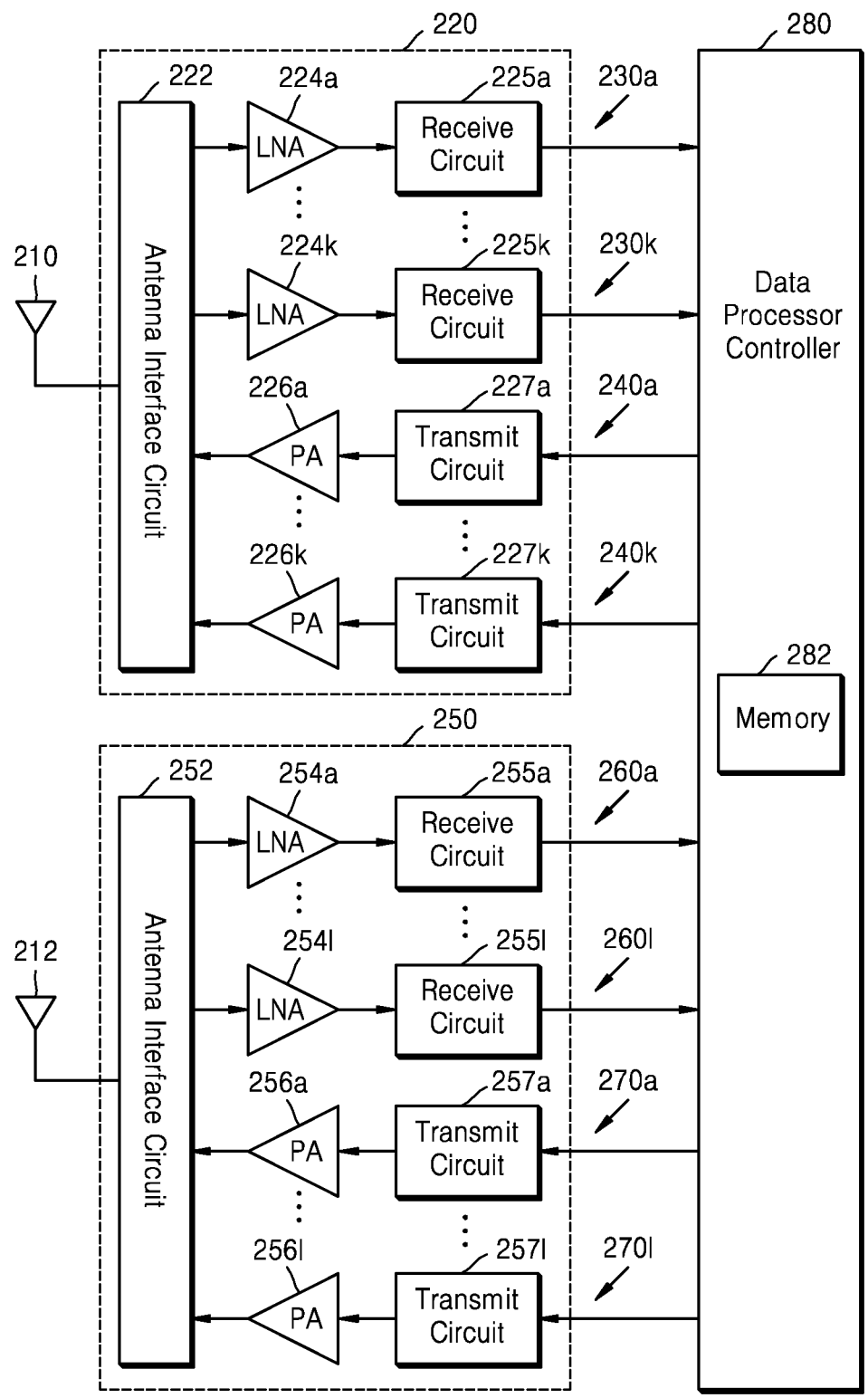

RADIO FREQUENCY (RF) INTEGRATED CIRCUIT PERFORMING SIGNAL AMPLIFICATION OPERATION TO SUPPORT CARRIER AGGREGATION AND RECEIVER INCLUDING THE SAME

CROSS-REFERENCE TO RELATED APPLICATION

This U.S. non-provisional application claims the benefit of priority under 35 U.S.C. 119 to Korean Patent Application No. 10-2018-0039334, filed on Apr. 4, 2018, in the Korean Intellectual Property Office, the disclosure of which is incorporated by reference in its entirety herein.

BACKGROUND

1. Technical Field

The inventive concept relates to a receiver supporting carrier aggregation, and more particularly, to a radio frequency (RF) integrated circuit for amplifying a received RF input signal and outputting the amplified RF input signal as an RF output signal, and a receiver including the RF integrated circuit.

2. Discussion of Related Art

A wireless communication device modulates an RF signal by transmitting data on a specific carrier wave, amplifies the modulated RF signal, and transmits the amplified modulated RF signal to a wireless communication network. In addition, the wireless communication device may receive an RF signal from a wireless communication network, amplify the received RF signal, and demodulate the amplified RF signal. To transmit and receive more data, the wireless communication device may support carrier aggregation, which involves transmission and reception of RF signals modulated with multiple carriers. Generally, a receiver (or a transceiver) of a wireless communication device for supporting carrier aggregation includes an antenna interface circuit (or an RF front-end module) for generating an RF input signal by filtering RF signals received through an antenna by frequency bands and an RF integrated circuit for amplifying the RF input signal and outputting the amplified RF input signal as an RF output signal.

When a wireless communication device supports carrier aggregation, an RF integrated circuit capable may be needed to prevent degradation due to noise or provide an amplification gain characteristic related to amplification of an RF input signal. Further, there is a need for an RF integrated circuit that is compatible with antenna interface circuits of different manufacturers.

SUMMARY

At least one embodiment of the inventive concept provides a radio frequency (RF) integrated circuit supporting carrier aggregation with improved noise characteristics or amplification gain characteristics and is compatible with various antenna interface circuits, and a receiver including the RF integrated circuit.

According to an exemplary embodiment of the inventive concept, there is provided a receiver including an amplification circuit supporting carrier aggregation (CA). The amplification circuit includes a first amplifier circuit configured to receive a radio frequency (RF) input signal at a block node from an outside source, and amplify the RF input signal to output the amplified RF input signal as a first RF output signal. The first amplifier circuit includes a first amplifier configured to receive the RF input signal through a first input node to amplify the RF input signal, and a first feedback circuit coupled between the first input node and a first internal amplification node of the first amplifier to provide feedback to the first amplifier.

According to an exemplary embodiment of the inventive concept, there is provided a radio frequency (RF) integrated circuit including an amplification circuit configured to support carrier aggregation. The amplification circuit includes a first amplifier circuit configured to receive an RF input signal at a block node from an outside source. The first amplifier circuit includes a first amplifier configured to amplify the RF input signal and output the amplified RF input signal as a first RF output signal. The first amplifier circuit includes a feedback circuit coupled between a first input node of the first amplifier receiving the RF input signal and a first internal amplification node of the first amplifier. The feedback circuit is configured to selectively provide feedback to the first amplifier according to whether a mode of the RF integrated circuit is set to one of a wideband mode and a narrowband mode.

According to an exemplary embodiment of the inventive concept, there is provided a method of controlling a receiver. The method includes: determining an operation mode of the receiver to be one of a narrowband mode and a wideband mode based on a configuration of an antenna interface circuit; setting a first control signal according to the determined mode; outputting the first control signal to the receiver to enable or disable a feedback circuit of the receiver; and connecting the receiver to the antenna interface circuit. The receiver includes an amplifier configured to receive a radio frequency (RF) input signal through an input node and amplify the received RF input signal. The feedback circuit is connected between the input node and an internal amplification node of the amplifier to provide feedback to the amplifier.

BRIEF DESCRIPTION OF THE DRAWINGS

Embodiments of the inventive concept will be more clearly understood from the following detailed description taken in conjunction with the accompanying drawings in which:

FIGS. 2A to 2D and FIGS. 3A and 3B are diagrams for explaining a description of carrier aggregation (CA);

FIG. 4 is a block diagram illustrating a wireless communication device of FIG. 1 according to an exemplary embodiment of the inventive concept;

DETAILED DESCRIPTION OF THE EXEMPLARY EMBODIMENTS

Below, embodiments of the inventive concept will be described in detail with reference to accompanying drawings.

Figure 1:
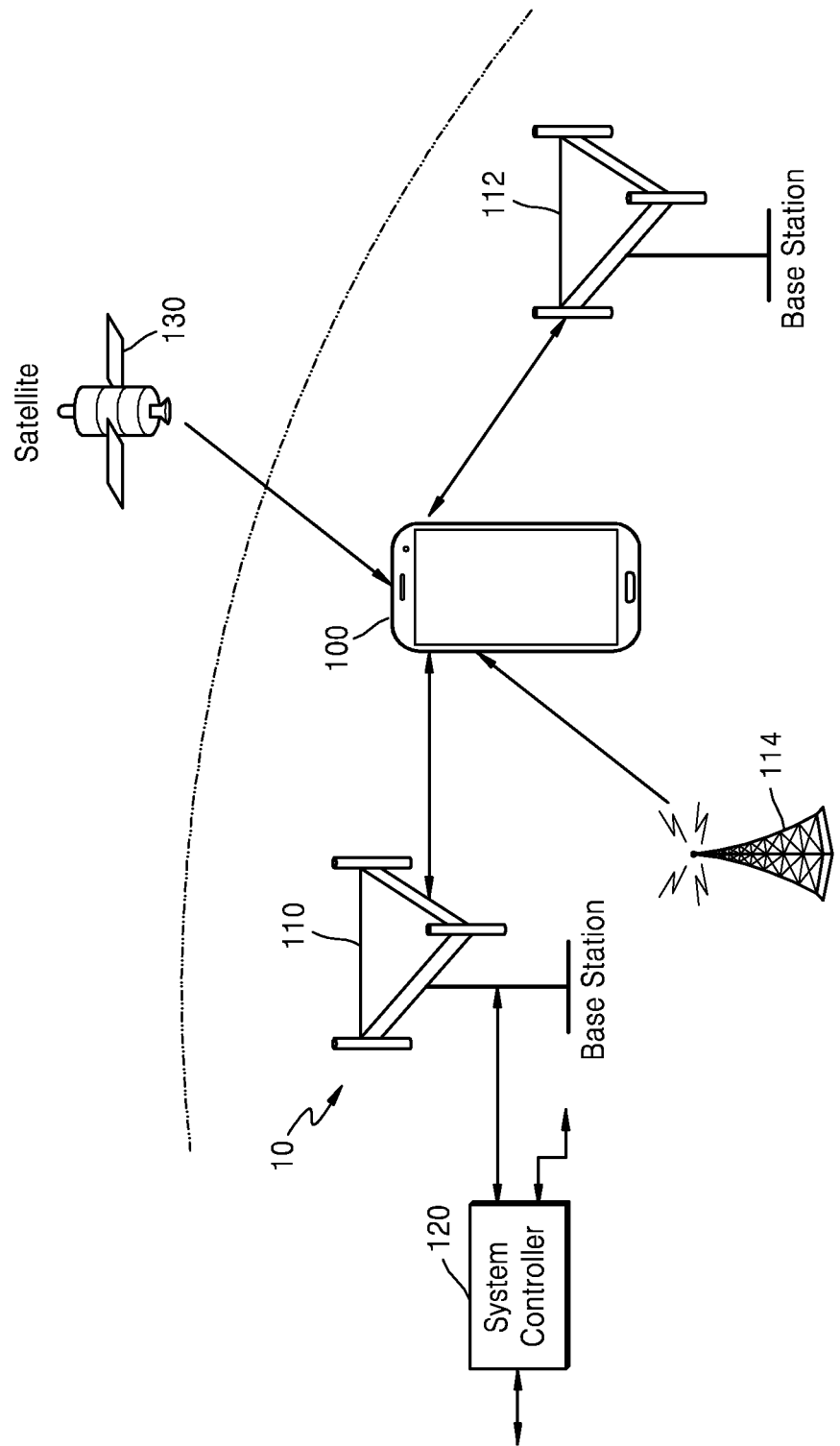
FIG. 1 is a diagram illustrating a wireless communication device for performing a wireless communication operation and a wireless communication system including the same.

FIG. 1 is a diagram illustrating a wireless communication device 100 for performing wireless communication operations and a wireless communication system 10 including the same.

Referring to FIG. 1, the wireless communication system 10 may be any of a long term evolution (LTE) system, a code division multiple access (CDMA) system, a global system for mobile communication (GSM), and a wireless local area network (WLAN). In addition, CDMA systems may be implemented in various CDMA versions, such as wideband CDMA (WCDMA), time division synchronous CDMA (TD-SCDMA), CDMA 2000.

The wireless communication system 10 may include at least two base stations 110 and 112 and a system controller 120. However, embodiments of the inventive concept are not limited thereto. For example, the wireless communication system 10 may include a plurality of base stations and a plurality of network entities. The wireless communication device 100 may be referred to as user equipment (UE), a mobile station (MS), a mobile terminal (MT), a user terminal (UT), a subscriber station (SS), and the like. The base stations 110 and 112 may include fixed stations that communicate with the wireless communication device 100 and/or other base stations, thereby transmitting and receiving a radio frequency (RF) signal including a data signal and/or control information. The base stations 110 and 112 may be referred to as a Node B, an evolved Node B (eNB), a base transceiver system (BTS), an access point (AP), and the like.

The wireless communication device 100 may communicate with the wireless communication system 10 and may receive signals from a broadcast station 114. Furthermore, the wireless communication device 100 may receive a signal from a satellite 130 of a global navigation satellite system (GNSS). The wireless communication device 100 may include radio equipment for performing a wireless communication (e.g., LTE, CDMA 2000, WCDMA, TD-SCDMA, GSM, 802.11, etc.).

In an exemplary embodiment, the wireless communication device 100 supports carrier aggregation for performing transmission and reception operations using a plurality of carriers. The wireless communication device 100 may perform wireless communication with the wireless communication system 10 in a low band, a mid band, and a high band. Each of the low band, mid band, and high band may be referred to as a band group, and each band group may include a plurality of frequency bands. For example, in LTE, one frequency band may cover up to 20 MHz. A carrier aggregation (hereinafter referred to as CA) may be classified into an intra-band CA and an inter-band CA. The intra-band CA refers to performing a wireless communication operation using a plurality of carriers within the same frequency band, and the inter-band CA refers to performing a wireless communication operation using a plurality of carriers within multiple frequency bands.

A receiver of the wireless communication device 100 according to an embodiment of the inventive concept may include an RF integrated circuit configured with improved noise characteristics or amplification gain characteristics when performing an amplification operation to process RF signals received from external devices (e.g., the base stations 110 and 112, the broadcast station 114, and the satellite 130). Furthermore, an RF integrated circuit according to an embodiment of the inventive concept may be compatible with antenna interface circuits of various types included in the wireless communication device 100.

FIGS. 2A to 2D and FIGS. 3A and 3B are diagrams for explaining a description of CA.

FIG. 2A is an exemplary diagram of intraband CA (i.e., intraband CA on contiguous carriers). Referring to FIG. 2A, the wireless communication device 100 of FIG. 1 transmits and receives signals using four adjacent carriers in the same frequency band of a low band.

Figure 2B:
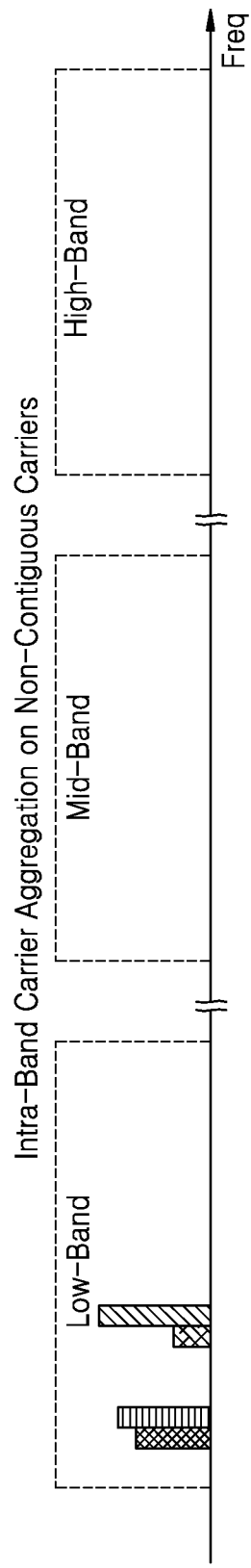

FIG. 2B is an exemplary diagram of intraband CA on non-contiguous carriers. Referring to FIG. 2B, the wireless communication device 100 performs transmission and reception of signals using four non-adjacent carriers within the same frequency band of a low band. Respective carriers may be spaced apart and may be separated by, for example, 5 MHz, 10 MHz, or another amount, respectively. Accordingly, the extents to which respective carriers are spaced may have various frequency magnitudes.

Figure 2C:
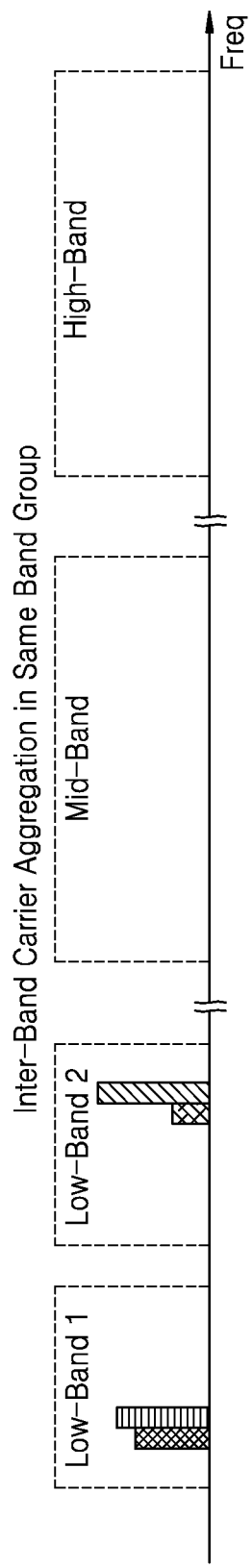

FIG. 2C is an exemplary diagram of inter-band CA in the same band group. Referring to FIG. 2C, the wireless communication device 100 performs transmission and reception of signals using four carriers in two frequency bands included in the same band group. For example, the low band may be divided into Low-Band 1 and Low-Band 2, where two of the four carriers correspond to Low-Band 1 and the remaining two carriers correspond to Low-Band 2.

Figure 2D:
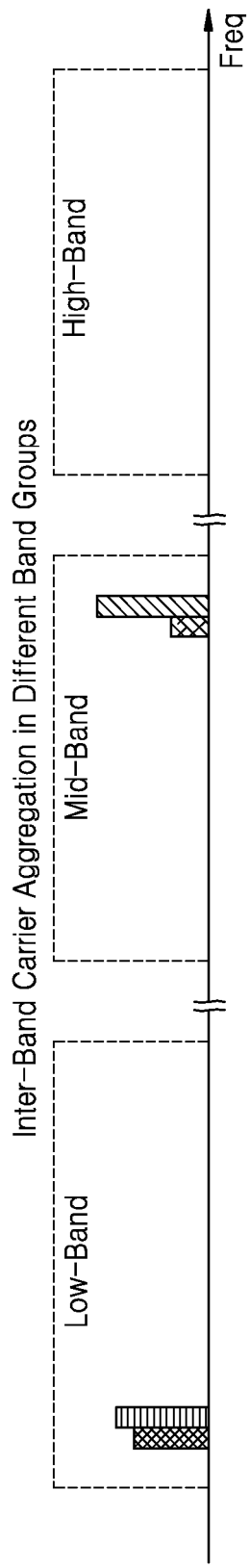

FIG. 2D is an exemplary diagram of inter-band CA across different band groups. Referring to FIG. 2D, the wireless communication device 100 performs transmission and reception of signals using four carriers distributed across multiple different band groups. Specifically, two carriers are carriers in one frequency band included in the low band, and the remaining two carriers are carriers in one frequency band included in the midband.

The inventive concept is not limited to specific CAs illustrated in FIGS. 2A to 2D. For example, the wireless communication device 100 may support various combinations of CAs for frequency bands or band groups.

Figure 3A:
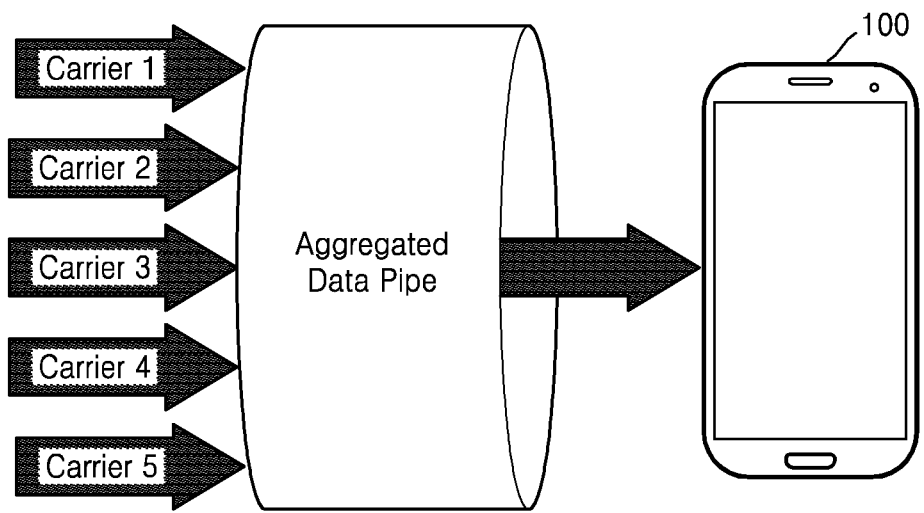

Referring to FIG. 3A, to meet the demand for an increased bit rate, there are techniques for CAs that combine and operate on multiple frequency bands at one or more base stations. Since long term evolution (LTE) for mobile networks realizes a data transmission speed of 100 Mbps, large capacity video may be transmitted and received smoothly in a wireless environment. FIG. 3A illustrates an example in which a data transmission rate is increased up to 5 times by combining five frequency bands according to the LTE standard using a carrier integration technique. In FIG. 3A, each of the carriers 1 to 5 is a carrier defined by LTE, and one frequency bandwidth is defined up to 20 MHz in the LTE standard. Therefore, the wireless communication device 100 according to an embodiment of the inventive concept may improve a data rate with a bandwidth of up to a maximum of 100 MHz.

Figure 3B:
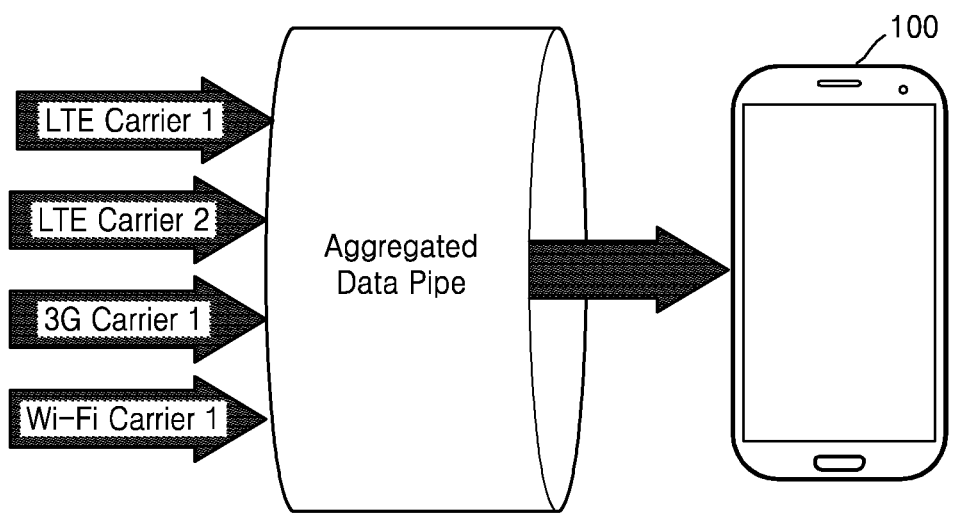

FIG. 3A illustrates an example in which only carrier waves defined in LTE are combined, but the inventive concept is not limited thereto. As illustrated in FIG. 3B, carriers of different wireless communication networks may also be combined with each other. Referring to FIG. 3B, frequency bands based on not only LTE but also 3G and Wi-Fi standards may be combined together by combining frequency bands using a carrier aggregation technique. As such, LTE-A may adopt the carrier aggregation technique to perform faster data transmission.

FIG. 4 is a diagram illustrating the wireless communication device 100 of FIG. 1 according to an exemplary embodiment of the inventive concept.

Referring to FIG. 4, a wireless communication device 200 includes a transceiver 220 connected to a primary antenna 210, a transceiver 250 connected to a secondary antenna 212, and a data processor (or controller) 280. The transceiver 220 includes a plurality of receivers 230a to 230k and a plurality of transmitters 240a to 240k. The transceiver 250 includes a plurality of receivers 260a-260l and a plurality of transmitters 270a-270l. The transceivers 220 and 250 may be implemented to support a plurality of frequency bands, a plurality of radio technologies, a carrier aggregation (CA), reception diversity, a multiple-input multiple-output (MIMO) scheme between a plurality of transmission antennas and a plurality of reception antennas, and the like.

As an example, each receiver of receivers 230a to 230k may include a low noise amplifier (LNA) 224a-224k and a receiving circuit 225a-225k. A configuration of a first receiver 230a may be applied to the other receivers 230b to 230k and 260a to 260l. Hereinafter, the configuration of the first receiver 230a will be mainly described. To receive data, the primary antenna 210 may receive an RF signal from a base station and/or a transmitter station, and the like. The primary antenna 210 may route the received RF signal, as an RF input signal generated through an operation such as frequency filtering, to a receiver selected through an antenna interface circuit 222. The antenna interface circuit 222 may include switch elements, a duplexer, a filter circuit, an input matching circuit, and the like. The antenna interface circuit 222 may be implemented as an RF front end module. Although the antenna interface circuit 222 of FIG. 4 is illustrated as being included in the transceiver 220, the antenna interface circuit 222 is not limited thereto. For example, the antenna interface circuit 222 may be located in a separate RF front-end module outside the transceiver 220. In an embodiment, the LNA 224a amplifies the received RF input signal and provides the amplified RF output signal to the receiving circuit 225a.

The LNA 224a according to an embodiment of the inventive concept includes a feedback circuit capable of improving noise characteristics or amplification gain characteristics during an amplification operation on an RF input signal. In addition, the LNA 224a may include a circuit configuration configured to be compatible with the antenna interface circuit 222 and antenna interface circuits of various different types to perform an efficient amplification operation.

In an embodiment, the receiving circuit 225a downconverts an RF output signal received from the LNA 224a from the RF band to a baseband to generate a baseband signal. The receiving circuit 225a may be referred to as an output circuit configured to output an RF output signal. The receiving circuit 225a may amplify and filter the baseband signal to provide the amplified and filtered baseband signal to the data processor 280. The receiving circuit 225a may include mixers, filters, amplifiers, oscillators, local oscillation generators, phase lock loop (PLL) circuits, and the like.

As an example, each of transmitters 240a to 240k may include a power amplifier 226a-226k and a transmission circuit 227a-227k. A configuration of a first transmitter 240a may be applied to the other transmitters 240b to 240k and 270a to 270l. For example, each of transmitters 270a to 270l may include a power amplifier 256a-256l and a transmission circuit 257a-257l. Hereinafter, a configuration of the first transmitter 240a will be mainly described. For data transmission, the data processor 280 may process the data to be transmitted (e.g., data encoding, data modulation) to provide the processed analog output signal to a selected transmitter.

In an embodiment, the transmission circuit 227a upconverts the analog output signal from the baseband to the RF band and amplifies and filters the upconverted output signal to generate a modulated RF signal. The transmission circuit 227a may include amplifiers, filters, mixers, input matching circuits, an oscillator, a local (LO) oscillator, a PLL circuit, and the like. In an embodiment, the power amplifier 226a receives and amplifies the modulated RF signal to provide a transmission RF signal having an appropriate output power level to the primary antenna 210 through the antenna interface circuit 222. An RF signal modulated through the primary antenna 210 may be transmitted to a base station or the like.

All or a portion of the transceivers 220 and 250 may be implemented as an analog integrated circuit, an RF integrated circuit, or a mixed-signal integrated circuit. For example, LNAs 224a-224k and 254a-254l and receiving circuits 225a-225k and 255a-255l may be implemented as one module (e.g., an RF integrated circuit). In addition, the circuit configuration of the transceivers 220 and 250 may be implemented in a variety of ways.

Figure 5A:
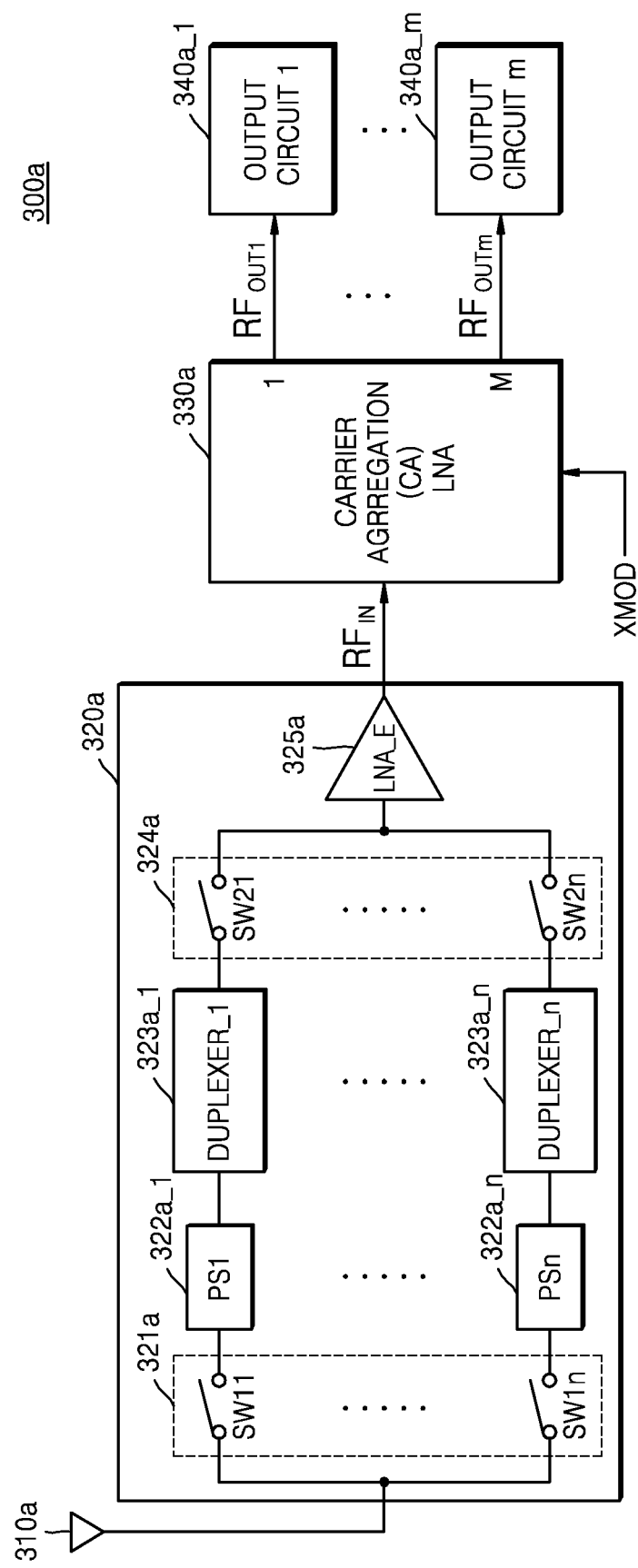
FIGS. 5A and 5B are diagrams for explaining an embodiment of an antenna interface circuit included in a receiver.
Figure 5B:
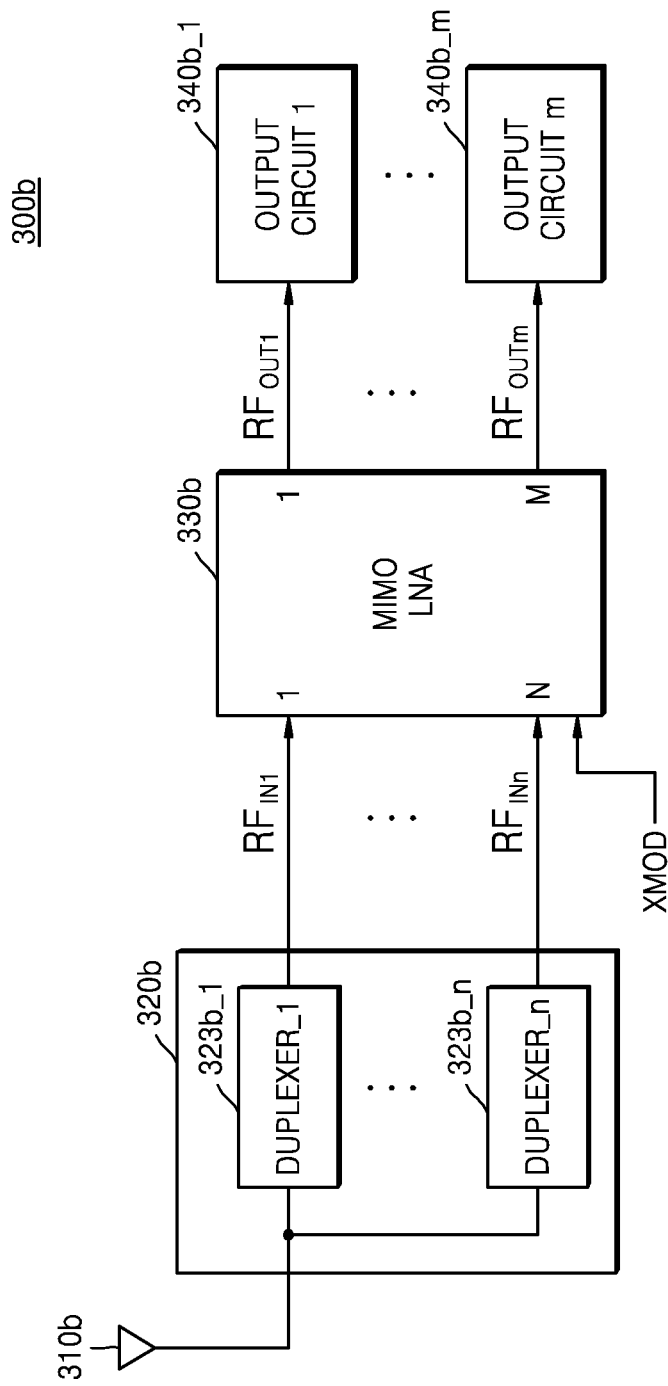

FIGS. 5A and 5B are diagrams for explaining implementation examples of antenna interface circuits 320a and 320b included in receivers 300a and 300b.

Referring to FIG. 5A, the receiver 300a includes an antenna 310a, an antenna interface circuit 320a, a carrier aggregation (CA) LNA 330a capable of supporting CA, and a plurality of output circuits 340a_1 to 340a_m. The CA LNA 330a may be applied to at least one of the LNAs 224 and 254 of FIG. 3. A configuration including the CA LNA 330a and the output circuits 340a_1 to 340a_m may be defined as an RF integrated circuit. The CA LNA 330a may include a single input unit and a multi (M) output unit. The receiver 300a may receive an RF signal (or a downlink signal) transmitted through an antenna 310a using at least one carrier in the same frequency band or in a different frequency band. The antenna 310a provides the received RF signal to the antenna interface circuit 320a.

The antenna interface circuit 320a includes a plurality of switching units (or multiplexers) 321a and 324a, a plurality of phase shift circuits 322a_1 to 322a_n, a plurality of duplexers 323a_1 to 323a_n, and an external amplifier 325a (or an external LNA LNA_E). Each of the switching units 321a and 324a includes switch elements SW11 to SW1n and SW21 to SW2n. A first switching unit 321a may route an RF signal to each of the phase shift circuits 322a_1 to 322a_n. Each of the phase shift circuits 322a_1 to 322a_n shift the routed RF signal by a predetermined phase to provide the shifted RF signal to each of the corresponding duplexers 323a_1 to 323a_n. In an exemplary embodiment, each of the phase shift circuit 322a_1 to 322a_n shift the routed RF signal by a different angle. In an embodiment, each of the duplexers 323a_1 to 323a_n filters the provided RF signal by a frequency band. The duplexers 323a_1 to 323a_n may include filters having different filtering frequency bands, respectively. For example, an RF signal filtered according a given filtering frequency band may filter out components that are outside the filtering frequency band. A second switching unit 324a routes the filtered RF signal to an external amplifier 325a. The external amplifier 325a amplifies the filtered RF signal and outputs the amplified filtered RF signal to the CA LNA 330a as an RF input signal $RF_{IN}$. Although not illustrated in FIG. 5A, the antenna interface circuit 320a may further include an impedance matching circuit for impedance matching between the antenna 310a and the CA LNA 330a.

The CA LNA 330a may be connected to the antenna interface circuit 320a through one port to receive the RF input signal $RF_{IN}$. Since a frequency spectrum of an RF input signal $RF_{IN}$ received by the CA LNA 330a is wide, the CA LNA 330a may include a circuit configuration capable of efficiently amplifying a wideband RF input signal $RF_{IN}$. A detailed circuit configuration of the CA LNA 330a will be described with reference to FIG. 6A.

The CA LNA 330a may amplify an RF input signal $RF_{IN}$ from intraband CA on contiguous carriers or intraband non-CA (i.e., intraband CA on non-contiguous carriers) to output one RF output signal through one LNA output terminal. Alternatively, the CA LNA 330a may amplify the RF input signal $RF_{IN}$ from the intraband CA by M carriers to output the amplified M RF output signals $RF_{OUT1}$ to $RF_{OUTm}$ through M LNA output units. The CA LNA 330a may receive a mode control signal XMOD from the outside and may operate in a single output mode or a multiple output mode based on the mode control signal XMOD. That is, the mode control signal XMOD may be a signal for controlling the CA LNA 330a to perform an amplification operation corresponding to any one of non-CA (i.e., intraband CA on non-contiguous carriers), the interband CA, and the intraband CA.

In a single output mode, the CA LNA 330a operates in a 1-input, 1-output configuration and receives an RF input signal $RF_{IN}$ including at least one signal transmitted by one carrier. A single output mode may be used to receive signals transmitted by one carrier without CA. In a multi-output mode, the CA LNA 330a may operate in the form of one input and M outputs, and thus receives an RF input signal $RF_{IN}$ including signals transmitted by a plurality of carriers, thereby outputting M RF output signals $RF_{OUT1}$ to $RF_{OUTm}$ to M output circuits 340a_1 to 340a_m, respectively. One RF output signal may correspond to one carrier. At least one of the output circuits 340a_1 to 340a_m may receive the RF output signal and may downconvert the received RF output signal to output the downconverted RF output signal as a baseband signal. The output circuits 340a_1 to 340a_m may correspond to the receiving circuits 225 and 255 of FIG. 3.

Referring to FIG. 5B, the receiver 300b includes an antenna 310b, an antenna interface circuit 320b, a multi input multi output (MIMO) LNA 330b capable of supporting CA, and a plurality of output circuits 340b_1 to 340b_m. The MIMO LNA 330b may be applied to at least one of the LNAs 224 and 254 of FIG. 3. A configuration including the MIMO LNA 330b and the output circuits 340b_1 to 340b_m may be referred to as an RF integrated circuit. The MIMO LNA 330b may include N multi input units and M multi output units. The receiver 300b may receive an RF signal (or downlink signal) transmitted via the antenna 310b using at least one carrier in the same frequency band or in a different frequency band. The antenna 310b provides the received RF signal to the antenna interface circuit 320b.

The antenna interface circuit 320b includes a plurality of duplexers 323b_1 to 323b_n. In an embodiment, each of the duplexers 320b_1 to 320b_n filter the received RF signal by a frequency band. The duplexers 320b_1 to 320b may include filters having different filtering frequency bands, respectively. For example, a duplexer 320b_1 may filter the RF signal to generate a first RF input signal $RF_{IN1}$ transmitted using a carrier within a first frequency band. In addition, an Nth Duplexer 323b_n may filter the RF signal to generate an Nth RF input signal $RF_{INn}$ transmitted using at least one carrier within the Nth frequency band. Although not illustrated in FIG. 5B, the antenna interface circuit 320b may further include an impedance matching circuit for impedance matching between the antenna 310b and the MIMO LNA 330b.

The MIMO LNA 330b may be coupled to the antenna interface circuit 320b through a plurality of ports (e.g., N ports) to receive the RF input signals $RF_{IN1}$ to $RF_{INn}$. Since a frequency spectrum of each of the RF input signals $RF_{IN1}$ to $RF_{INn}$ received by the MIMO LNA 330b through the plurality of ports is narrow, the MIMO LNA 330b may include circuit configurations capable of efficiently amplifying narrowband RF input signals $RF_{IN1}$ to $RF_{INn}$, respectively. A detailed circuit configuration of the MIMO LNA 330b will be described with reference to FIG. 6B.

The MIMO LNA 330b may receive one to N RF input signals $RF_{IN1}$ to $RF_{INn}$. For example, the MIMO LNA 330b may amplify not only one RF input signal received at non-CA or intraband CA but also N RF input signals received at the inter-band CA. The MIMO LNA 330b may amplify RF input signals $RF_{IN1}$ to $RF_{INn}$ to generate one to N to output RF output signals $RF_{OUT1}$ to $RF_{OUTm}$ to output the amplified RF input signals $RF_{IN1}$ to $RF_{INn}$ to the output circuits 340b_1 to 340b_m, respectively.

The MIMO LNA 330b may receive a mode control signal XMOD from outside and may operate in any one of a single output mode, an intra-band CA mode, and an inter-band CA mode based on the mode control signal XMOD. In the single output mode, the MIMO LNA 330b operates in a one input and one output configuration. In addition, the MIMO LNA 330b may receive an RF input signal including at least one signal transmitted by one carrier and may amplify the received RF input signal to output one RF output signal. In the intra-band CA mode, the MIMO LNA 330b operates in a one input and M output configuration. In addition, the MIMO LNA 330b may receive an RF input signal transmitted through a plurality of carriers in the same frequency band and may amplify the received RF input signal to output one to M RF output signals $RF_{OUT1}$ to $RF_{OUTm}$ to M output circuits 340b_1 to 340b_m, respectively. One RF output signal may correspond to a carrier having a predetermined frequency. In the interband CA mode, the MIMO LNA 330b operates in the form of N inputs and M outputs. At least one of the output circuits 340b_1 to 340b_m may receive the RF output signal and may downconvert the received RF output signal to output it as a baseband signal.

However, the inventive concept is not limited to the antenna interface circuits 320a and 320b illustrated in FIGS. 5A and 5B. For example, the antenna interface circuit 320a or 320b may be replaced antenna interface circuits of different configurations.

Figure 6A:
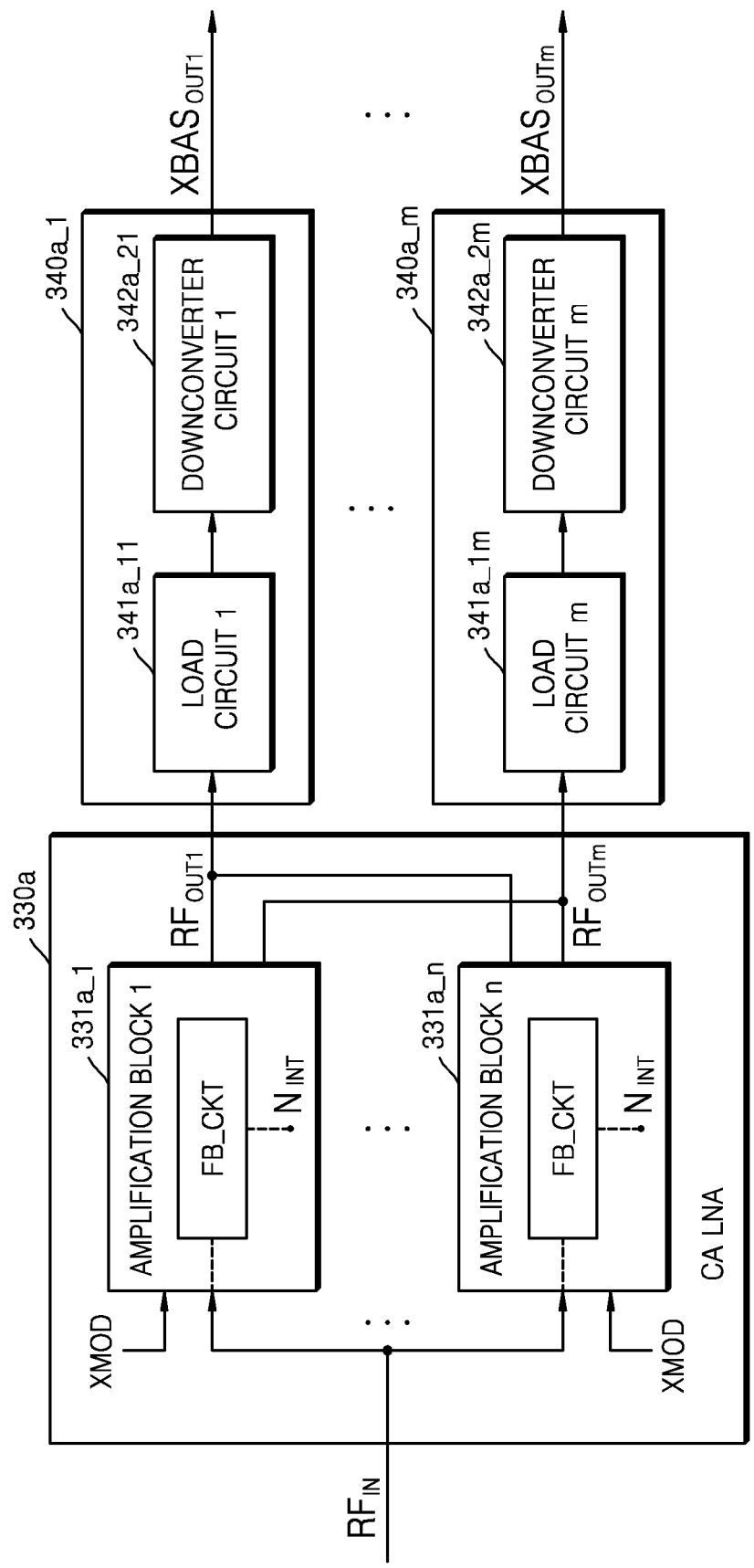
FIG. 6A is a block diagram specifically illustrating a CA low noise amplifier (LNA) and output circuits of FIG. 5A.
Figure 6B:
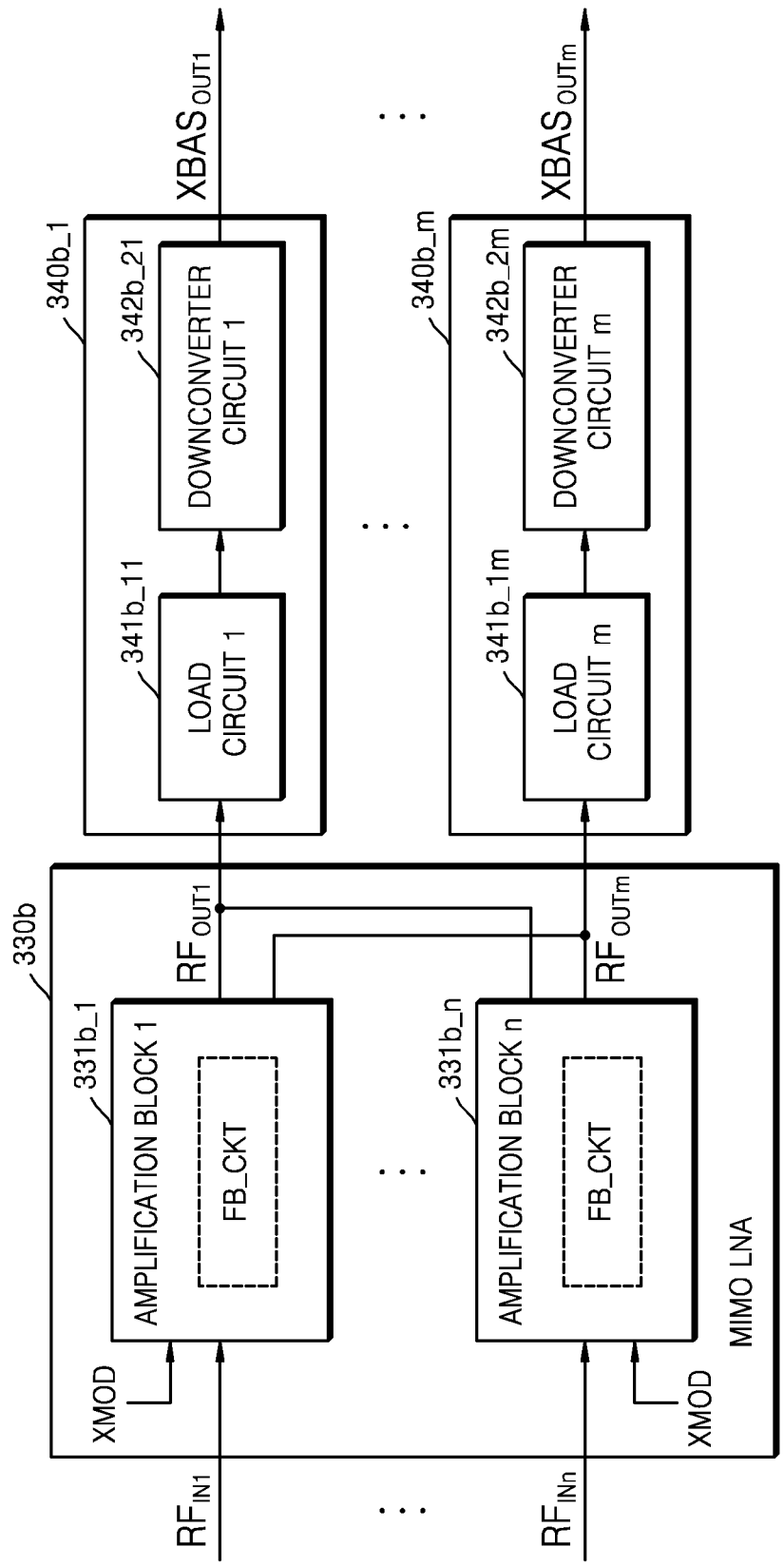
FIG. 6B is a block diagram specifically illustrating a multi input multi output (MIMO) LNA and output circuits of FIG. 5B.

FIG. 6A is a block diagram specifically illustrating the CA LNA 330a and the output circuits 340a_1 to 340a_m in FIG. 5A, and FIG. 6B is a block diagram specifically illustrating the MIMO LNA 330b and the output circuits 340b_1 to 340b_m in FIG. FIG. 5B. A configuration including a CA LNA 330a and output circuits 340a_1 to 340a_m in FIG. 6A, the MIMO LNA 330b, and output circuits 340b_1 to 340b_m in FIG. 6B may be defined as an RF integrated circuit.

Referring to FIG. 6A, the CA LNA 330a includes a plurality of amplification blocks 331a_1 to 331an. The amplification blocks 331a_1 to 331a_n may receive and amplify the RF input signal $RF_{IN}$ from the outside via one port to output RF output signals $RF_{OUT1}$ to $RF_{OUTm}$. As described in FIG. 5A, the frequency spectrum of the RF input signal $RF_{IN}$ may be wide, and thus the RF integrated circuit may operate in a wide-band mode.

The amplification blocks 331a_1 to 331a_n may include a plurality of amplifier circuits, respectively. Amplifier circuits included in the amplification blocks 331a_1 to 331a_n may be connected to output circuits 340a_1 to 340a_m, respectively. For example, a first amplification block 331a_1 may include M amplifier circuits, and the amplifier circuits may be connected in a one-to-one correspondence with the M output circuits 340a_1-340a_m. A connection configuration between the first amplification block 331a_1 and the output circuits 340a_1 to 340a_m may be applied to a connection configuration between the remaining amplification blocks 331a_2 to 331a_n and the output circuits 340a_1 to 340a_m. The amplification blocks 331a_1 to 331a_n may receive a mode control signal XMOD capable of enabling or disabling amplifier circuits of the amplifier blocks according to the CA operation mode. Each of the amplifier circuits may perform an amplification operation on the RF input signal $RF_{IN}$ based on the mode control signal XMOD.

An amplifier circuit according to an embodiment of the inventive concept includes a feedback circuit FB_CKT configured to provide a specific impedance to maintain an input impedance of the amplifier circuit within a predetermined range and improves a noise characteristic or an amplification gain. For example, in the intra-band CA operation, since a broadband RF input signal $RF_{IN}$ is received at one port, when the RF input signal $RF_{IN}$ is amplified and classified by a frequency, signal degradation, power imbalance, or the like for each frequency of a signal in the RF input signal $RF_{IN}$ may occur. Since the amplifier circuit includes a feedback circuit FB_CKT, the above-described negative effects may be reduced or eliminated.

In an embodiment, the amplifier circuit include an amplifier configured to receive the RF input signal $RF_{IN}$ via the input node and amplify the received RF input signal $RF_{IN}$. In an embodiment, the feedback circuit FB_CKT is connected between an input node of the amplifier and an internal amplification node $N_{INT}$ to provide feedback to the amplifier. Amplification blocks 331a_1 to 331a_n may include at least one amplifier circuit provided with the above-described feedback circuit FB_CKT. Furthermore, the amplification blocks 331a_1 to 331a_n may include at least one amplifier circuit provided with a feedback circuit FB_CKT configured to be enabled and/or disabled.

The first output circuit 340a_1 includes a load circuit 341a_11 and a downconverter circuit 342a_21. A configuration of the first output circuit 340a_1 may be applied to the other output circuits 340a_2 to 340a_m. Each of the output circuits 340a_1 to 340a_m may receive and downconvert any one of RF output signals $RF_{OUT1}$ to $RF_{OUTm}$ to output baseband signals $XBAS_{OUT1}$ to $XBAS_{OUTm}$. In an embodiment, the downconverter circuit 342a_21 receives an input signal and converts the received input signal to an output signal having a lower frequency that the input signal.

Referring to FIG. 6B, a MIMO LNA 330b includes a plurality of amplification blocks 331b_1 to 331bn. The amplification blocks 331b_1 to 331b_n receive and amplify RF input signals $RF_{IN1}$ to $RF_{INn}$ to output RF output signals $RF_{OUT1}$ to $RF_{OUTm}$, respectively. As described in FIG. 5B, since a frequency spectrum of each of the RF input signals $RF_{IN1}$ to $RF_{INn}$ is narrow, an RF integrated circuit may operate in a narrow-band mode.

The amplification blocks 331b_1 to 331b_n may include a plurality of amplifier circuits, respectively. Amplifier circuits included in the amplification blocks 331b_1 to 331b_n may be connected to output circuits 340b_1 to 340b_m, respectively. A connection configuration between the amplification blocks 331b_1 to 331b_n and the output circuits 340b_1 to 340b_m is the same as the connection configuration between the amplification blocks 331a_1 to 331b_n and the output circuits 340b_1 to 340b_m described in FIG. 6A, and a detailed description will be omitted.

Unlike an amplifier circuit FIG. 6A, an amplifier circuit of FIG. 6B according to an exemplary embodiment of the inventive concept does not include the feedback circuit FB_CKT, or the feedback circuit FB_CKT is disabled. That is, when the RF integrated circuit is in the narrow band mode, the feedback circuit FB_CKT is not used or the amplifier circuit is implemented not to include the feedback circuit FB_CKT. In an alternative embodiment, the amplifier circuit includes the feedback circuit FB_CKT, but is implemented to disable it.

In an embodiment, the amplifier circuit includes an amplifier configured to receive the RF input signal $RF_{IN}$ via the input node and amplify the received RF input signal $RF_{IN}$. The first output circuit 340b_1 may include a load circuit 341b_11 and a downconverter circuit 342b_21. A configuration of the first output circuit 340b_1 may be applied to the other output circuits 340b_2 to 340b_m. The output circuits 340b_1 to 340b_m may receive and downconvert any one of RF output signals $RF_{OUT1}$ to $RF_{OUTm}$ to output baseband signals $XBAS_{OUT1}$ to $XBAS_{OUTm}$.

Figure 7A:
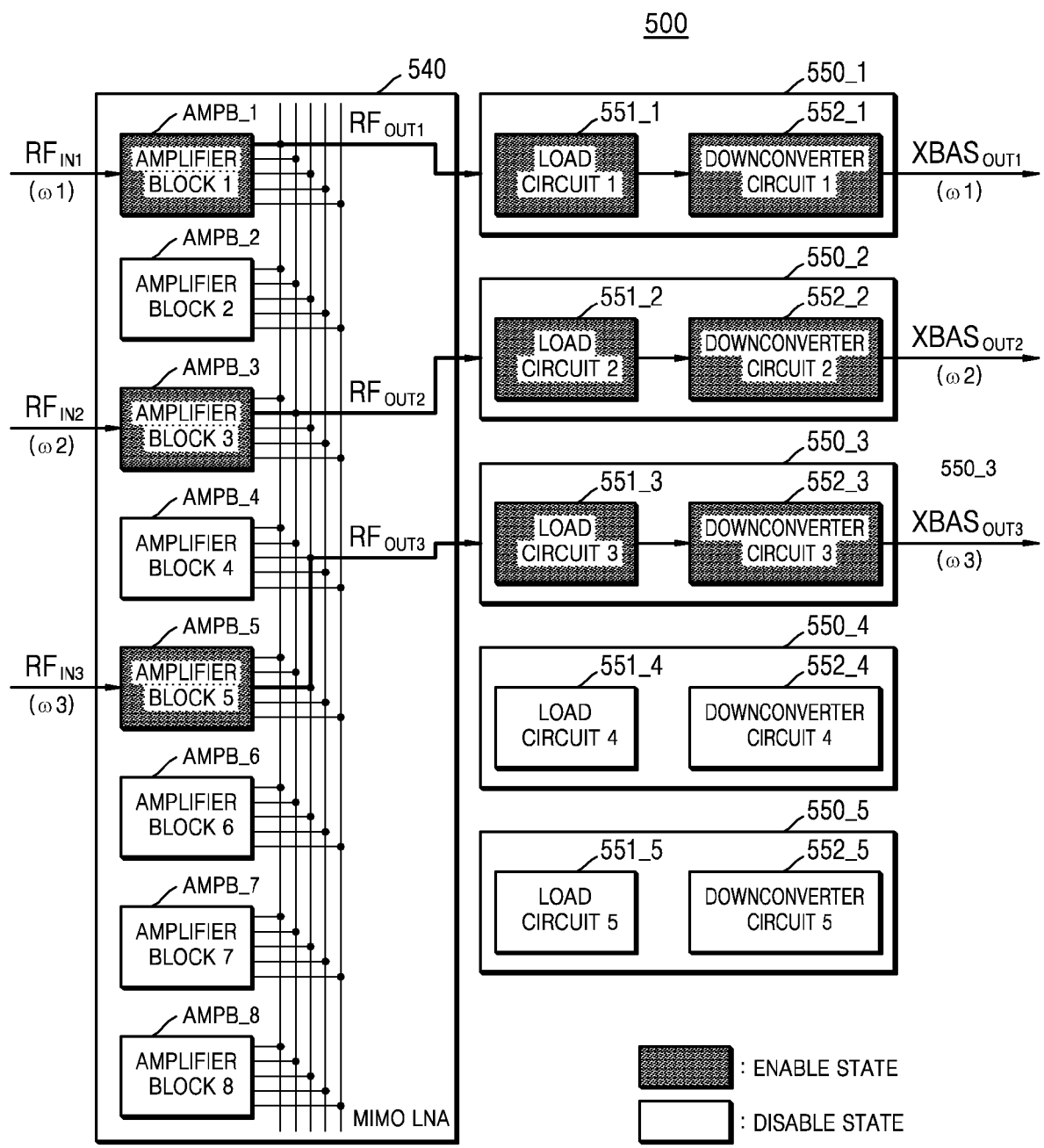
FIG. 7A is a diagram for explaining an operation of a receiver in an interband CA.
Figure 7B:
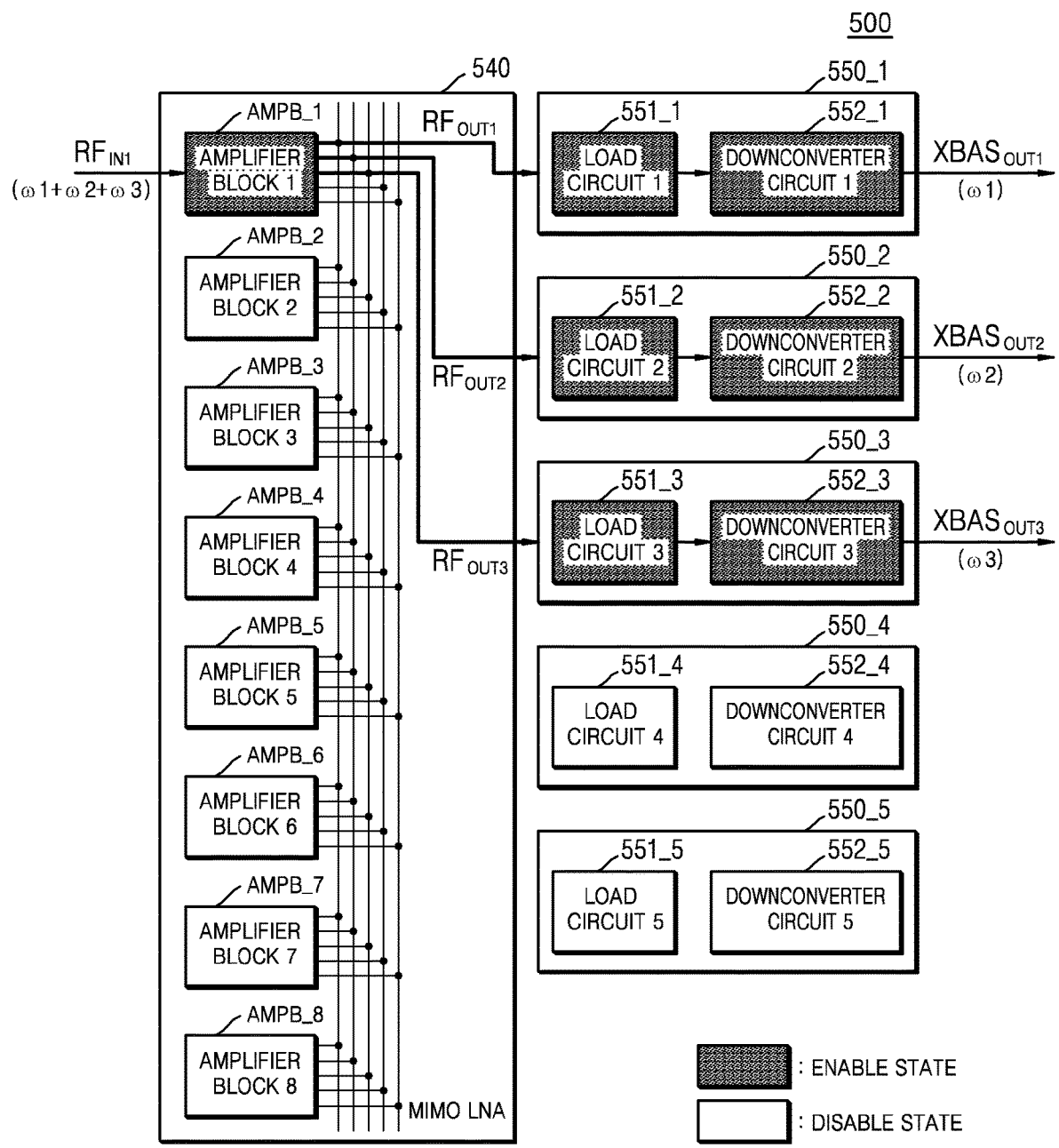
FIG. 7B is a diagram for explaining an operation of a receiver in an intraband CA.

FIG. 7A is a diagram for explaining an operation of a receiver 500 in an interband CA, and FIG. 7B is a diagram for explaining the operation of the receiver 500 in an intraband CA.

Referring to FIG. 7A, a receiver 500 includes a MIMO LNA 540 and first to fifth output circuits 550_1 to 550_5, and the MIMO LNA 540 may include first to eighth amplification blocks AMPB_1 to AMPB_8. Hereinafter, it will be assumed that an RF signal is transmitted using a first carrier ω1 of a first frequency band, a second carrier ω2 of the third frequency band, and a third carrier ω3 of a fifth frequency band at the base station. The first output circuit 550_1 includes a first load circuit 551_1 and a first downconverter circuit 552_1. The second output circuit 550_2 includes a second load circuit 551_2 and a second downconverter circuit 552_2. The third output circuit 550_3 includes a third load circuit 551_3 and a third downconverter circuit 552_3. The fourth output circuit 550_4 includes a fourth load circuit 551_4 and a fourth downconverter circuit 552_4. The fifth output circuit 550_5 includes a fifth load circuit 551_5 and a fifth downconverter circuit 552_5.

First, some number of amplification blocks AMPB_1, AMPB_3, and AMPB_5 of amplification blocks AMPB_1 to AMPB_8 are enabled, and the enabled amplification blocks AMPB_1, AMPB_3, and AMPB_5 receive RF input signals $RF_{IN1}$ to $RF_{IN3}$ corresponding to three carriers (i.e., the first to third carriers) ω1 to ω3, respectively. The first amplification block AMPB_1 amplifies the first to third RF input signals $RF_{IN1}$ to $RF_{IN3}$ and outputs the amplified first to third RF output signals $RF_{OUT1}$ to $RF_{OUT3}$ to the enabled first to third output circuits 550_1 to 550_3, respectively. The enabled output circuits 550_1 to 550_3 may output baseband signals $XBAS_{OUT1}$ to $XBAS_{OUT3}$ corresponding to the three carriers ω1 to ω3, respectively.

Referring to FIG. 7B, the receiver 500 includes a CA LNA 540 and first through fifth output circuits 550_1 to 550_5, and the MIMO LNA 540 may include first to eighth amplification blocks AMPB_1 to AMPB_8. Hereinafter, it will be assumed that a base station transmits an RF signal using the first carrier ω1, the second carrier ω2 and the third carrier ω3 in the same frequency band. As described above, at least one amplifier circuit included in the first to eighth amplification blocks AMPB_1 to AMPB_8 may include a feedback circuit.

First, a first amplification block AMPB_1 of the amplification blocks AMPB_1 to AMPB_8 is enabled and the enabled amplification block AMPB_1 amplifies the first RF input signal $RF_{IN1}$ corresponding to the first to third carriers ω1 to ω3. The first amplification block AMPB_1 amplifies the first RF input signal $RF_{IN1}$ to output the first RF output signal $RF_{OUT1}$ corresponding to the first carrier ω1 to the enabled first output circuit 550_1. In addition, the first amplification block AMPB_1 amplifies the first RF input signal $RF_{IN1}$ to output the second RF output signal $RF_{OUT2}$, corresponding to the second carrier ω2, to the enabled second output circuit 550_2. Finally, the first amplification block AMPB_1 amplifies the first RF input signal $RF_{IN1}$ to output the third RF output signal $RF_{OUT3}$, corresponding to the third carrier ω3, to the enabled third output circuit 550_3. The enabled output circuits 550_1 to 550_3 may output baseband signals $XBAS_{OUT1}$ to $XBAS_{OUT3}$ corresponding to the three carriers ω1 to ω3, respectively. Hereinafter, a detailed configuration of an amplification block according to an embodiment of the inventive concept will be described.

Figure 8A:
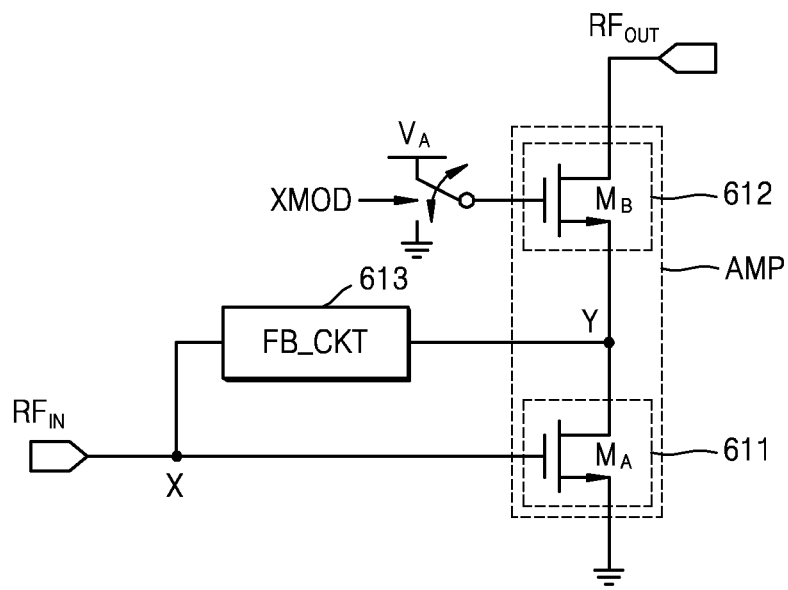
FIGS. 8A to 8C are block diagrams illustrating an embodiment of an amplification block of FIG. 6A.
Figure 8B:
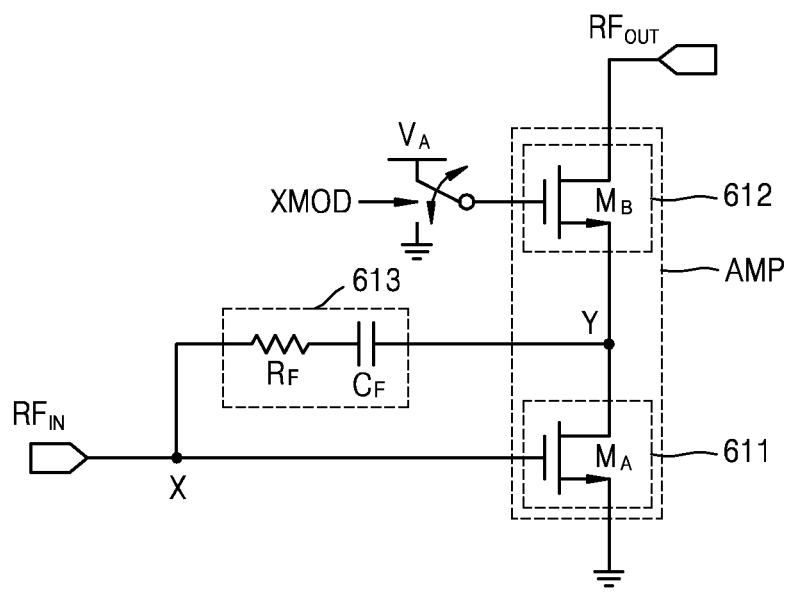
Figure 8C:
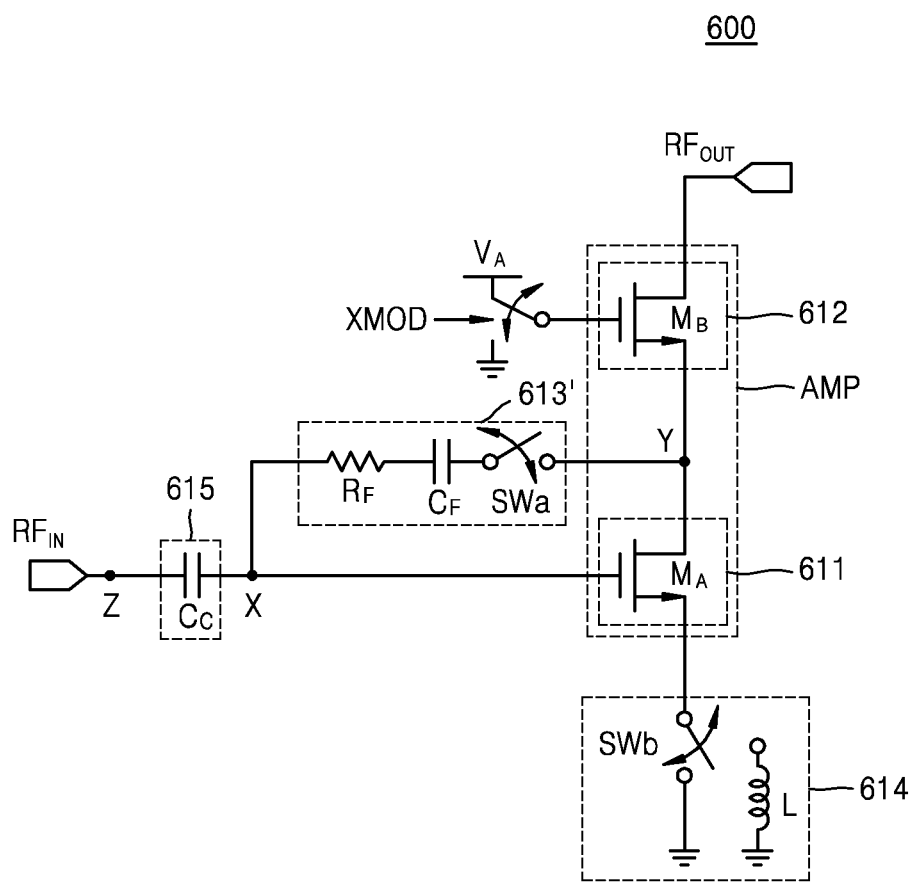

FIGS. 8A to 8C are block diagrams illustrating an embodiment of a configuration of the amplification blocks 331a_1 to 331a_n in FIG. 6A.

Referring to FIG. 8A, an amplifier circuit 600 includes an amplifier AMP and a feedback circuit 613. The amplifier AMP includes a first transistor 611 and a second transistor 612. In FIG. 8A, the first transistor 611 and the second transistor 612 are implemented with NMOS transistors, but the inventive concept is not limited thereto, and various types of transistors may be implemented.

A gate of the first transistor 611 receives the RF input signal $RF_{IN}$ through an input node X of an amplifier AMP. In an embodiment, a source of the first transistor 611 is grounded and a drain of the first transistor 611 is coupled to a source of the second transistor 612 and an internal amplification node Y of the amplifier AMP. A gate of the second transistor 612 may be grounded or receive a predetermined voltage $V_A$ based on a mode control signal XMOD. It is possible to control enabling/disabling of the amplifier AMP (or the amplifier circuit 600) by turning on/off the second transistor 612 using the mode control signal XMOD. An RF output signal $RF_{OUT}$ may be output through the drain of the second transistor 612. Each of the first transistor 611 and the second transistor 612 may be implemented as a cascode transistor (i.e., an equivalent circuit such as a resistance, capacitance, node, or terminal). That is, the first transistor 611 and the second transistor 612 are connected in series, the first transistor 611 may operate as a common source amplifier as an input terminal, and the second transistor 612 may operate as a common gate amplifier as an output terminal, and thus the amplifier AMP may operate as a cascode amplifier.

A feedback circuit 613 according to an embodiment of the inventive concept is coupled between the input node X and the internal amplification node Y. A feedback circuit 613 may provide feedback to the amplifier AMP by applying an output from the internal amplification node Y to the input node X. The feedback circuit 613 may be implemented to keep an input impedance of the amplifier circuit 600 within a certain range or to have a specific impedance to have an appropriate target impedance. In addition, the feedback circuit 613 may be implemented to improve the linearity with respect to the amplification gain of the amplifier AMP. Referring to FIG. 8B, the feedback circuit 613 may include at least one resistance element $R_F$ and at least one capacitor element $C_F$.

Referring to FIG. 8C, the amplifier circuit 600 further includes a ground connection circuit 614 and a coupling capacitor CC 615. The ground connection circuit 614 includes a switching element SWb and an inductor L. The feedback circuit 613' of the amplifier circuit 600 further includes a switch element SWa as compared to the feedback circuit 613 of FIG. 8b. The inductor L may be a source degeneration inductor, and one terminal of the inductor L may be grounded. The amplifier circuit 600 according to an embodiment of the inventive concept determines a mode according to a configuration of an antenna interface circuit connected to the amplifier circuit, and switch elements SWa and SWb are controlled based on the determined mode. The coupling capacitor (CC) 615 may have a sufficiently large capacitance so as to have a smaller impedance compared to the feedback circuit 613'. The amplifier circuit 600 is not limited to the arrangement of the coupling capacitor CC 615 illustrated in FIG. 8C. The coupling capacitor CC 615 may be connected between the input node X and the gate of the first transistor 611 and may be arranged in parallel with a feedback circuit 613'. In this case, an input node Z of the amplification block and the input node X of the amplifier AMP may be the same node.

In an embodiment, when the amplifier circuit 600 is connected to an antenna interface circuit 320a of FIG. 5A, a mode of the amplifier circuit 600 is determined as a wideband mode, a switch element SWa is closed, and a switch element SWb is grounded. When the amplifier circuit 600 is connected to an antenna interface circuit 320b of FIG. 5B, the mode of the amplifier circuit 600 is determined as a narrow band mode, the switch element SWa is opened, and the switch element SWb is connected to one terminal of an inductor L whose other terminal is connected to a ground terminal.

That is, when the mode of the amplifier circuit 600 is in the wide band mode, an impedance matching operation may be performed through the feedback circuit 613 to improve the noise characteristic of the amplifier AMP and the feedback circuit 613 may provide feedback to the amplifier AMP, thereby improving the linearity of an amplification operation of the amplifier AMP. When the mode of the amplifier circuit 600 is in the narrow band mode, the impedance matching may be performed through the inductor L to improve the noise characteristic of the amplifier AMP. Furthermore, linearity characteristics of the amplification operation of the amplifier AMP may be improved through the inductor L.

As such, since an amplifier circuit 600 of FIG. 8C is compatible with various antenna interface circuits, it may be possible to perform an efficient amplification operation on the RF input signal $RF_{IN}$ when the CA operation is performed.

Figure 9A:
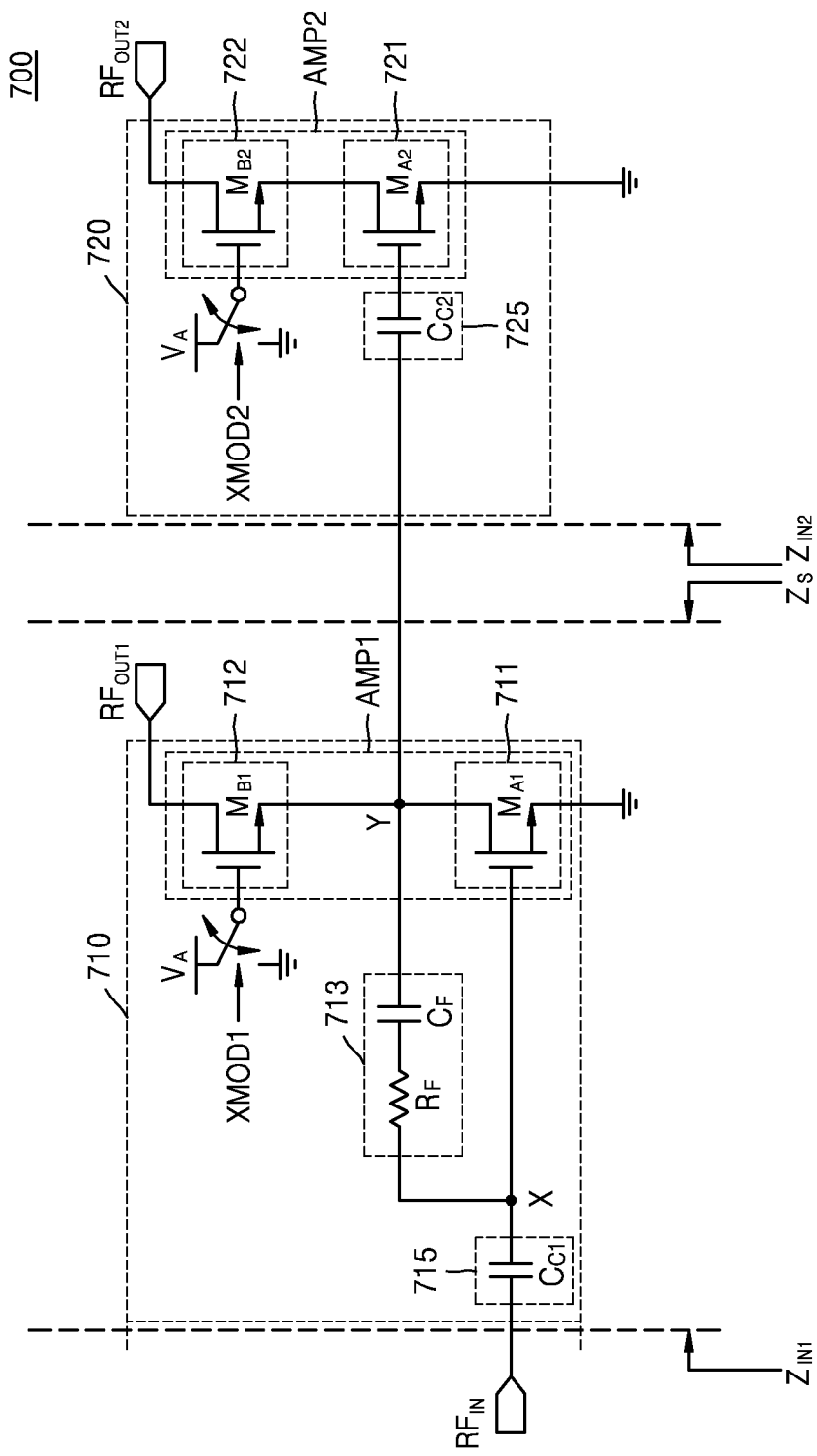
FIGS. 9A and 9B are block diagrams illustrating an embodiment of a plurality of amplifier circuits included in the amplification block of FIG. 6A.
Figure 9B:
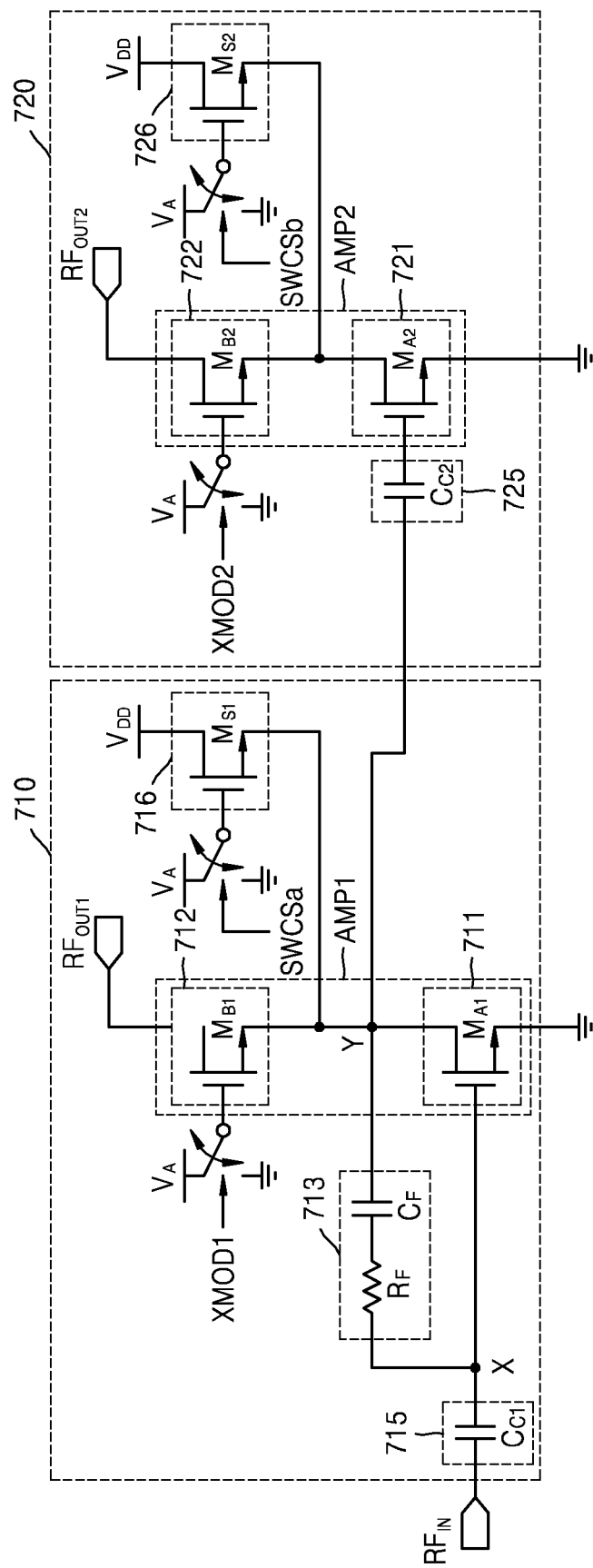

FIGS. 9A and 9B are block diagrams illustrating an embodiment of a plurality of amplifier circuits included in the amplification blocks 331a_1 to 331a_n in FIG. 6A.

Referring to FIG. 9A, an amplification block 700 includes a first amplifier circuit 710 and a second amplifier circuit 720. The first amplifier circuit 710 includes a first amplifier AMP1, a feedback circuit 713 and a first coupling capacitor 715. The first amplifier circuit 710 amplifies the RF input signal $RF_{IN}$ and outputs the amplified signal $RF_{IN}$ to a first output signal $RF_{OUT1}$. The second amplifier circuit 720 includes a second amplifier AMP2 and a second coupling capacitor 725. The second amplifier circuit 720 is implemented not to include the feedback circuit 713 of the first amplifier circuit 710. Thus a configuration of the second amplifier circuit 720 is different from that of the first amplifier circuit 710. Configurations of the first amplifier circuit 710 and the second amplifier circuit 720 are described in detail in FIGS. 8A to 8C, and hereinafter, the description will be focused on features that have not been described above.

In an embodiment, the second amplifier AMP2 includes a third transistor 721 and a fourth transistor 722, and may correspond to a cascode amplifier. The second amplifier circuit 720 is connected in series with an internal amplification node Y of the first amplifier AMP1. The second amplifier AMP2 receives a signal from the internal amplification node Y through an input node of the second amplifier AMP2, and amplifies the signal to output the amplified signal as a second output signal $RF_{OUT2}$.

In an embodiment, an amplification gain corresponding to the internal amplification node Y has a predetermined value. That is, a signal output from the internal amplification node Y is a signal obtained by amplifying the RF input signal $RF_{IN}$ by a predetermined amplification gain. In an embodiment, a transconductance of each of a first transistor 711 and a second transistor 712 are different from one another so that the amplification gain corresponding to the internal amplification node Y has a predetermined value. For example, a transconductance of the first transistor 711 may be greater than a transconductance of the second transistor 712, and thus the internal amplification node Y may have an amplification gain greater than a reference value. The amplification gain at the internal amplification node Y may be expressed as—gm1/gm2 (where gm1 is a transconductance of the first transistor 711 and gm2 is the transconductance of the second transistor 712. The transconductance of the first transistor 711 and the second transistor 712 may be realized to have different values by adjusting widths (or width functions) of the transistors 711 and 712, respectively.

Since the second amplifier circuit 720 receives a signal whose input signal $RF_{IN}$ is amplified by a predetermined amplification gain through the internal amplification node Y, a power consumed to output a second RF output signal $RF_{OUT2}$ having the same magnitude as a magnitude of a first RF output signal $R_{FOUT1}$ may be lower than a power consumed by the first amplifier circuit 710 to output the first RF output signal $RF_{OUT1}$. In an embodiment, an amplification gain of the second amplifier circuit 720 (or the second amplifier AMP2) is different from that of the first amplifier circuit 710 (or the first amplifier AMP1) such that the magnitude of the second RF output signal $RF_{OUT2}$ is equal to that of the first RF output signal $RF_{OUT1}$.

In an embodiment, an amplification gain of an internal amplification node (i.e., a node where the drain of the third transistor 721 and the source of the fourth transistor 722 are connected) of the second amplifier AMP2 of the second amplifier circuit 720 is different from an amplification gain of an internal amplification node Y of the first amplifier AMP1 of the first amplifier circuit 710. Accordingly, a transconductance ratio between the first transistor 711 and the second transistor 712 of the first amplifier AMP1 is different from that between a third transistor 721 and a fourth transistor 722 of the second amplifier AMP2.

In an embodiment, the feedback circuit 713 has a sufficient impedance so that the input impedance $Z_{IN1}$ viewed from the input terminal of the amplification block 700 is maintained within a predetermined range irrespective of whether the second amplifier circuit 720 is enabled or disabled. Furthermore, since an input impedance $Z_S$ to a source of the second transistor 712 in the first amplifier circuit 710 is much greater than an input impedance $Z_{IN2}$ to a gate of the third transistor 721 in the second amplifier circuit 720, current leakage does not occur or is reduced from the internal amplification node Y to the gate of the third transistor 721. Thus, there is an effect that the amplification gain of the signal path to the first RF output signal $RF_{OUT1}$ is not lost.

However, the inventive concept is not limited to the amplification block 700 illustrated in FIG. 9A. For example, a plurality of amplifier circuits other than the second amplifier circuit 720 may be connected in parallel through the internal amplification node Y. The plurality of amplifier circuits may be the same as a configuration of the second amplifier circuit 720.

Referring to FIG. 9B, the first amplifier circuit 710 and the second amplifier circuit 720 further include current regulating circuits 716 and 726, respectively, as compared with the amplification block 700 of FIG. 9A. The current regulating circuit 716 includes transistor $M_{S1}$ and the current regulating circuit 726 includes transistor $M_{S2}$. The transistor $M_{S1}$ may be turned on and off by switching control signal SWCSa and the transistor $M_{S2}$ may be turned on and off by switching control signal SWCSb. Specifically, when there is a need to reduce magnitudes of the RF output signals $RF_{OUT1}$ and $RF_{OUT2}$, the transistors $M_{S1}$ and $M_{S2}$ may be turned on. When the transistors $M_{S1}$ and $M_{S2}$ are turned on, the RF output signals $RF_{OUT1}$ and $RF_{OUT2}$ having magnitudes smaller than those when the transistors $M_{S1}$ and $M_{S2}$ are turned off may be output, respectively. Amplification gains of the first amplifier circuit 710 and the second amplifier circuit 720 may be adjusted using the current regulating circuits 716 and 726, respectively.

However, the inventive concept is not limited to the current regulating circuits 716 and 726 illustrated in FIG. 9B. The amplification gain of the first amplifier circuit 710 and the second amplifier circuit 720 may be implemented with various circuits. In addition, each of the amplifier circuits 710 and 720 may each include more current regulating circuits.

Figure 10:
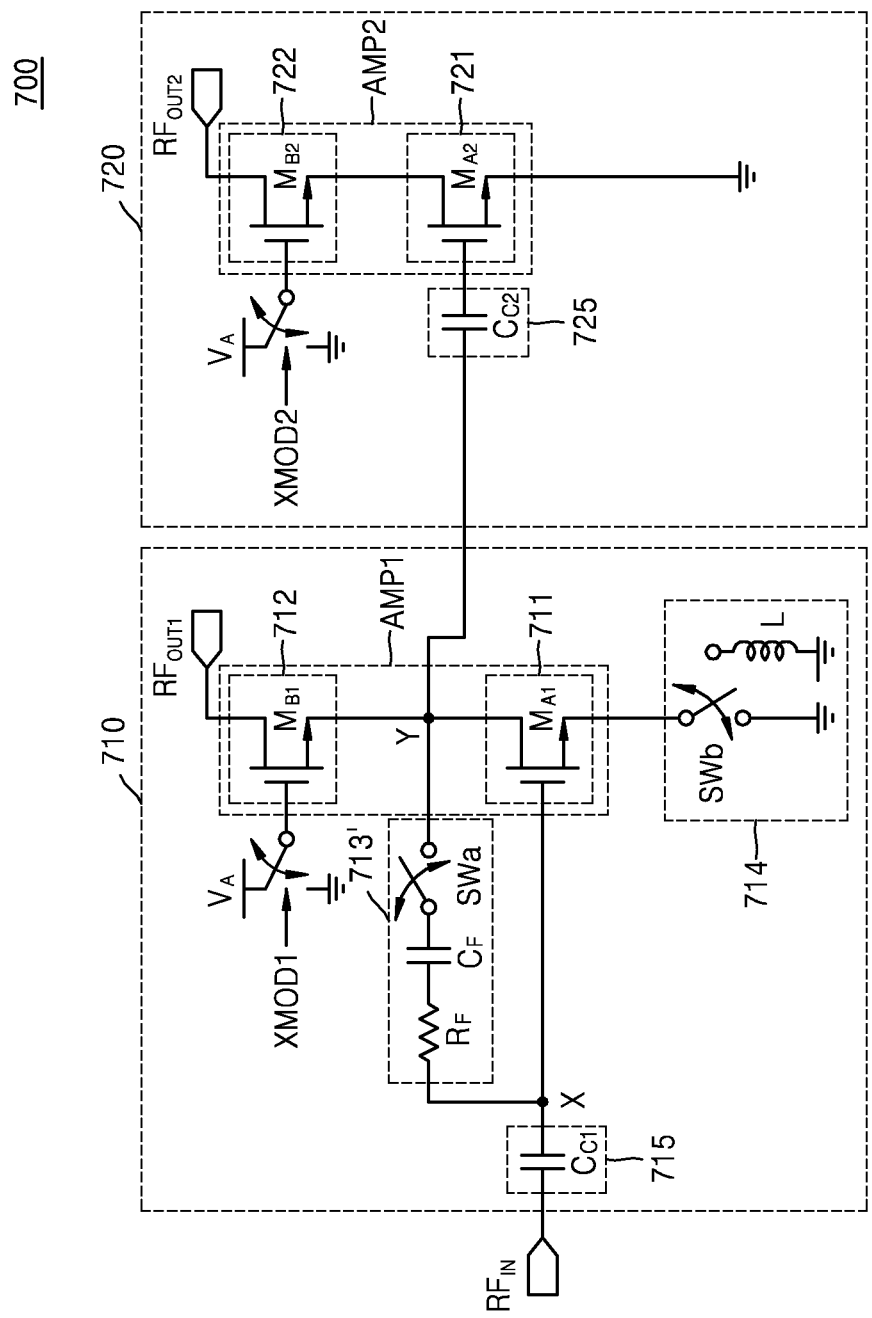
FIG. 10 is a block diagram illustrating an embodiment of a plurality of amplifier circuits included in the amplification block of FIG. 6A, which is compatible with various interface circuits.

FIG. 10 is a block diagram illustrating an embodiment of a plurality of amplifier circuits included in the amplification blocks 331a_1 to 331a_n of FIG. 6A, which is compatible with various interface circuits.

Referring to FIG. 10, the first amplifier circuit 710 compared with that of FIG. 9A further includes a ground connecting circuit 714 provided with a switching element SWb and an inductor L. The feedback circuit 713' of the first amplifier circuit 710 further includes a switch element SWa as compared to the feedback circuit 713 of FIG. 9B. The second amplifier circuit 720 of FIG. 10 may have the same configuration as the second amplifier circuit 720 illustrated in FIG. 9A.

In an embodiment, when the amplification block 700 is coupled to the antenna interface circuit 320a of FIG. 5A, a mode of the amplification block 700 is determined to be a wide band mode, a switch element SWa is closed, and a switch element SWb is connected to a ground node (or ground potential). When the amplification block 700 is connected to the antenna interface circuit 320b of FIG. 5B, a mode of an amplification block 800 is determined to be a narrow band mode, the switch element SWa is opened, and the switch element SWb is connected to one terminal of an inductor L whose other terminal is connected to ground. In an embodiment, the amplification block 700 is connected/coupled to an antenna interface circuit using a switch element that is turned on/off with a control signal.

Figure 11A:
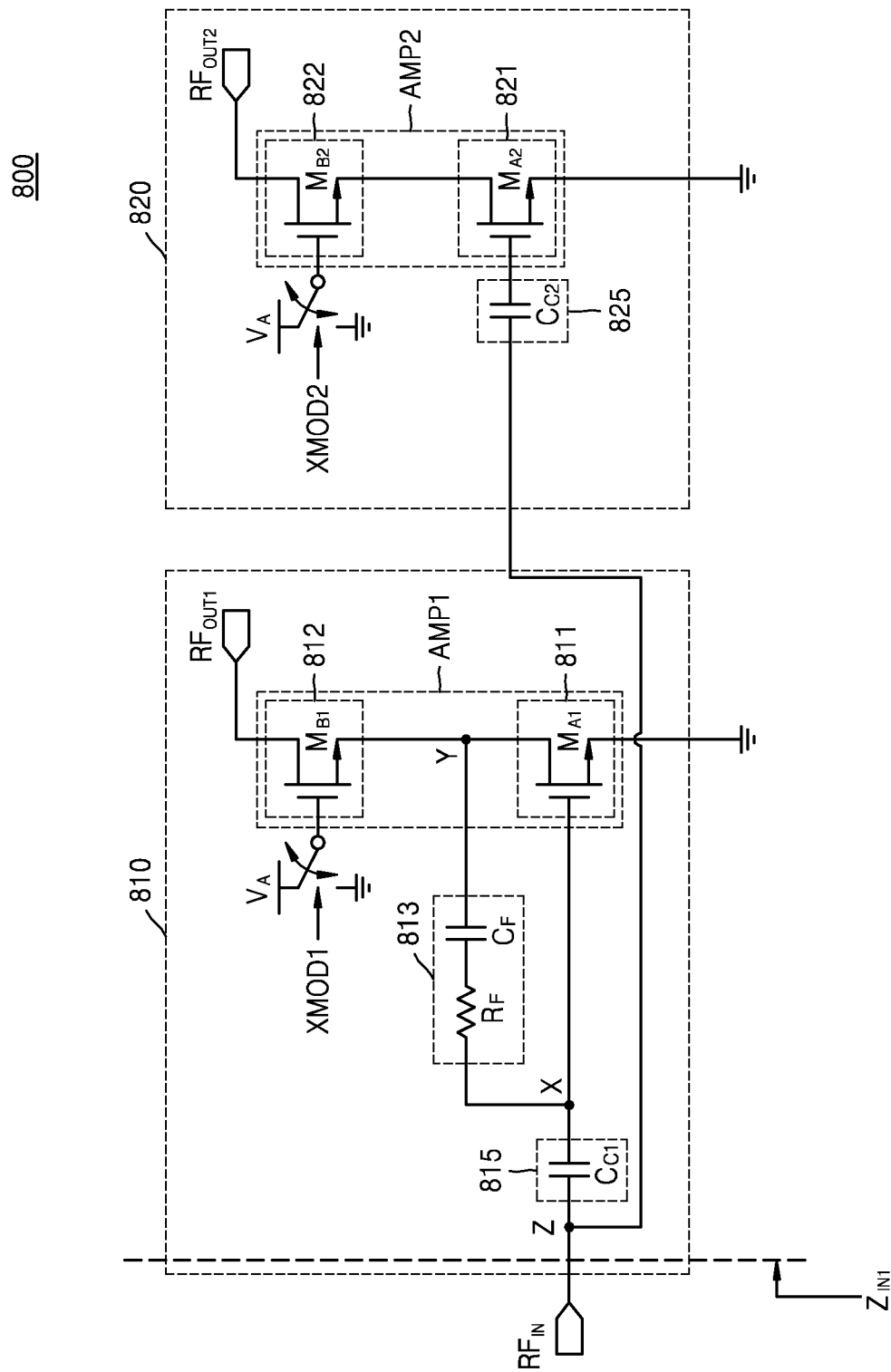
FIGS. 11A and 11B are block diagrams illustrating an embodiment of a plurality of amplifier circuits included in the amplification block of FIG. 6A.
Figure 11B:
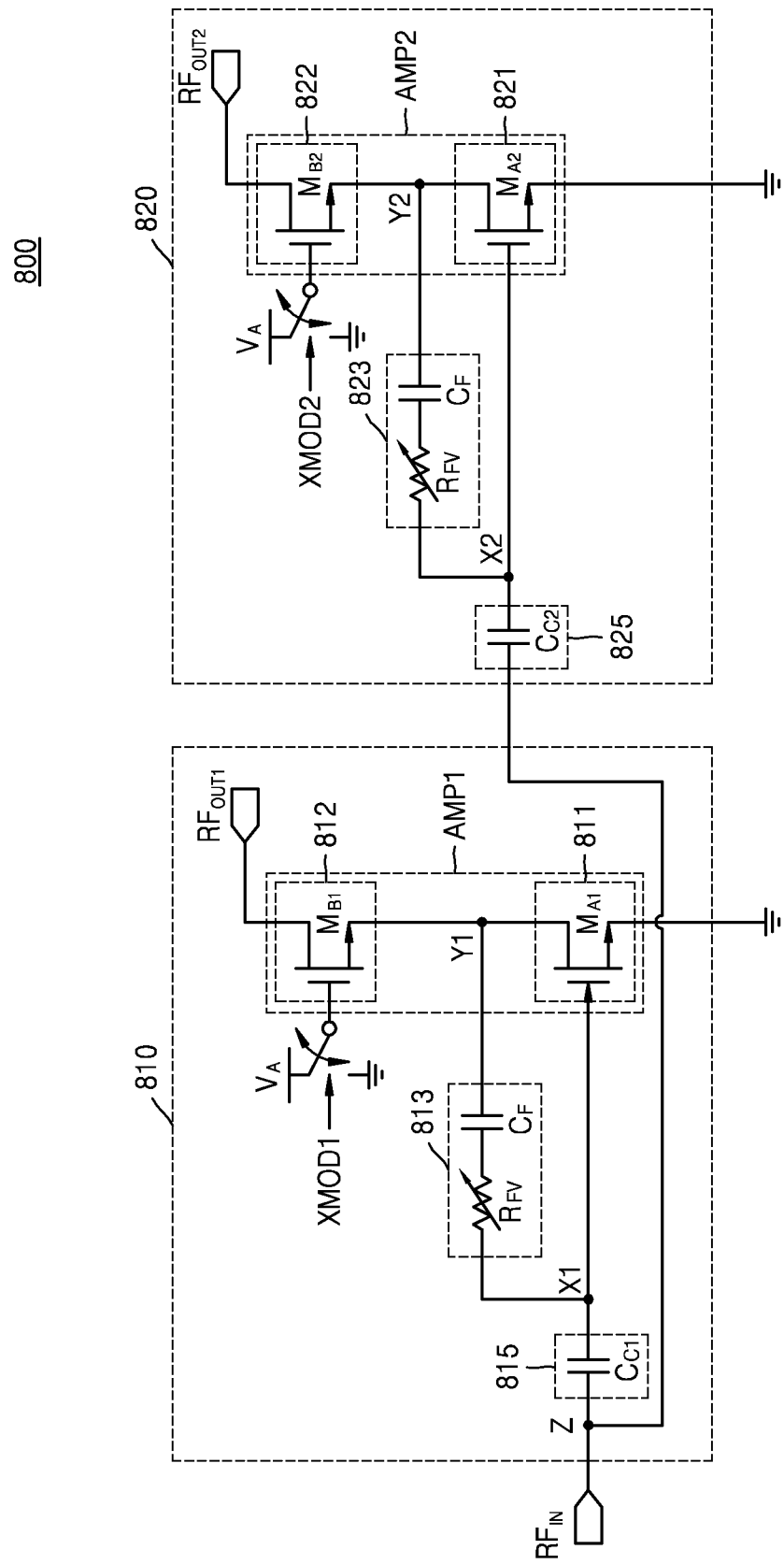

FIGS. 11A and 11B are block diagrams illustrating an embodiment of a plurality of amplifier circuits included in the amplification blocks 331a_1 to 331a_n of FIG. 6A.

Referring to FIG. 11A, the amplification block 800 includes a first amplifier circuit 810 and a second amplifier circuit 820. The first amplifier circuit 810 includes a first amplifier AMP1, a feedback circuit 813, and a first coupling capacitor $C_{C1}$ 815. The first amplifier circuit 810 amplifies the RF input signal $RF_{IN}$ to output the first RF output signal $RF_{OUT1}$. The second amplifier circuit 820 includes a second amplifier AMP2 and a second coupling capacitor $C_{C2}$ 825. The second amplifier circuit 820 is implemented not to include the feedback circuit 813 of the first amplifier circuit 810. Thus a configuration of the second amplifier circuit 820 is different from that of the first amplifier circuit 810. The first amplifier AMP1 includes a first transistor 811 and a second transistor 812. The second amplifier AMP2 includes a first transistor 821 and a second transistor 822.

The amplification block 800 includes a block node Z, and the first amplifier circuit 810 and the second amplifier circuit 820 are connected in parallel through the block node Z. Unlike the amplification block 700 of FIG. 9A, the amplification gain of the first amplifier circuit 810 is the same as that of the second amplifier circuit 820.

In an embodiment, the feedback circuit 813 has a sufficient impedance such that an input impedance $Z_{IN1}$ viewed from an input terminal of the amplification block 800 is maintained within a predetermined range irrespective of whether the second amplifier circuit 820 is enabled or disabled. The input impedance $Z_{IN1}$ may be dependent on the impedance of the feedback circuit 813 because an input impedance to the gate of the third transistor 821 is much greater than the impedance of the feedback circuit 813. Accordingly, the amplification block 800 may perform a stable impedance matching with the antenna using the feedback circuit 813.

The inventive concept is not limited to the amplification block 800 illustrated in FIG. 11A. For example, a plurality of amplifier circuits other than the second amplifier circuit 820 may be connected in parallel through the block node Z. The plurality of amplifier circuits may be the same as a configuration of the second amplifier circuit 820.

Referring to FIG. 11B, a feedback circuit 813 (i.e., a first feedback circuit) of the first amplifier circuit 810 compared with FIG. 11A includes at least one variable resistive element $R_{FV}$ and the second amplifier circuit 820 further includes a second feedback circuit 823. The second feedback circuit 823 includes at least one variable resistive element $R_{FV}$ and at least one capacitor element $C_F$. In an embodiment, the second feedback circuit 823 is connected between a second internal amplification node Y2 of the second amplifier AMP2 and a second input node X2 of the second amplifier AMP2. The second feedback circuit 823 provides an output of the second internal amplification node Y2 as a feedback to the second amplifier AMP2. For example, the variable resistance element $R_{FV}$ may be a rheostat, a potentiometer, a digital resistor, etc.

Variable resistive elements $R_{FV}$ of the feedback circuits 813 and 823 may be controlled such that an input impedance $Z_{IN1}$ viewed from the input terminal of the amplification block 800 is maintained within a predetermined range regardless of whether the second amplifier circuit 820 is enabled or disabled. In an embodiment, a first resistance value of the variable resistive element $R_{FV}$ when only the first amplifier circuit 810 is enabled is less than a second resistance value of the variable resistive element $R_{FV}$ when both of the first amplifier circuit 810 and the second amplifier circuit 820 are enabled. For example, the second resistance value may be implemented to be approximately twice as large as the first resistance value.

The inventive concept is not limited to the amplification block 800 illustrated in FIG. 11B. For example, a plurality of amplifier circuits other than the second amplifier circuit 820 may be connected in parallel through the block node Z. The plurality of amplifier circuits may be the same as the configuration of the first amplifier circuit 810.

Figure 12A:
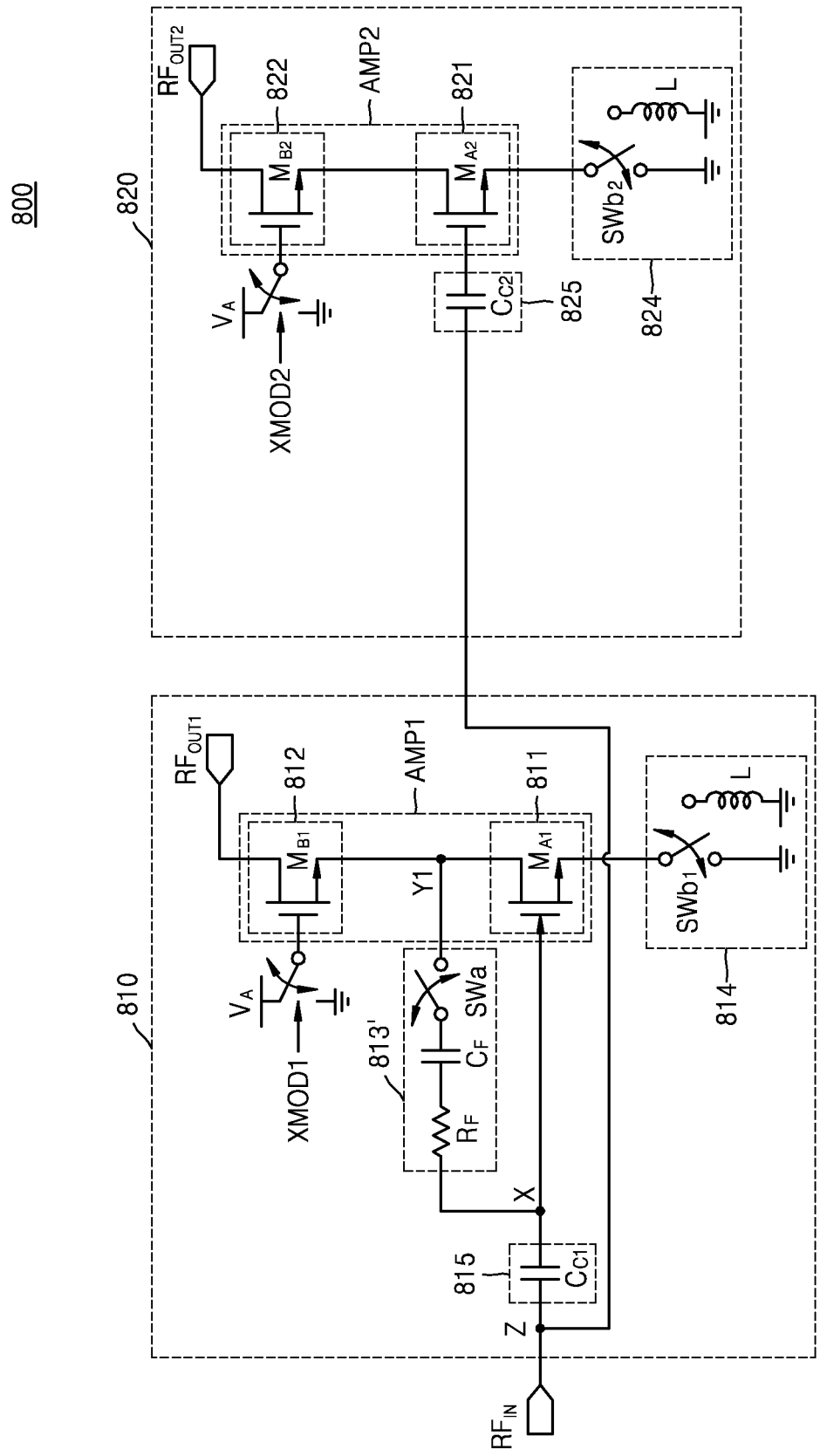
FIGS. 12A and 12B are block diagrams illustrating an embodiment of a plurality of amplifier circuits included in the amplification block of FIG. 6A, which is compatible with various interface circuits.
Figure 12B:
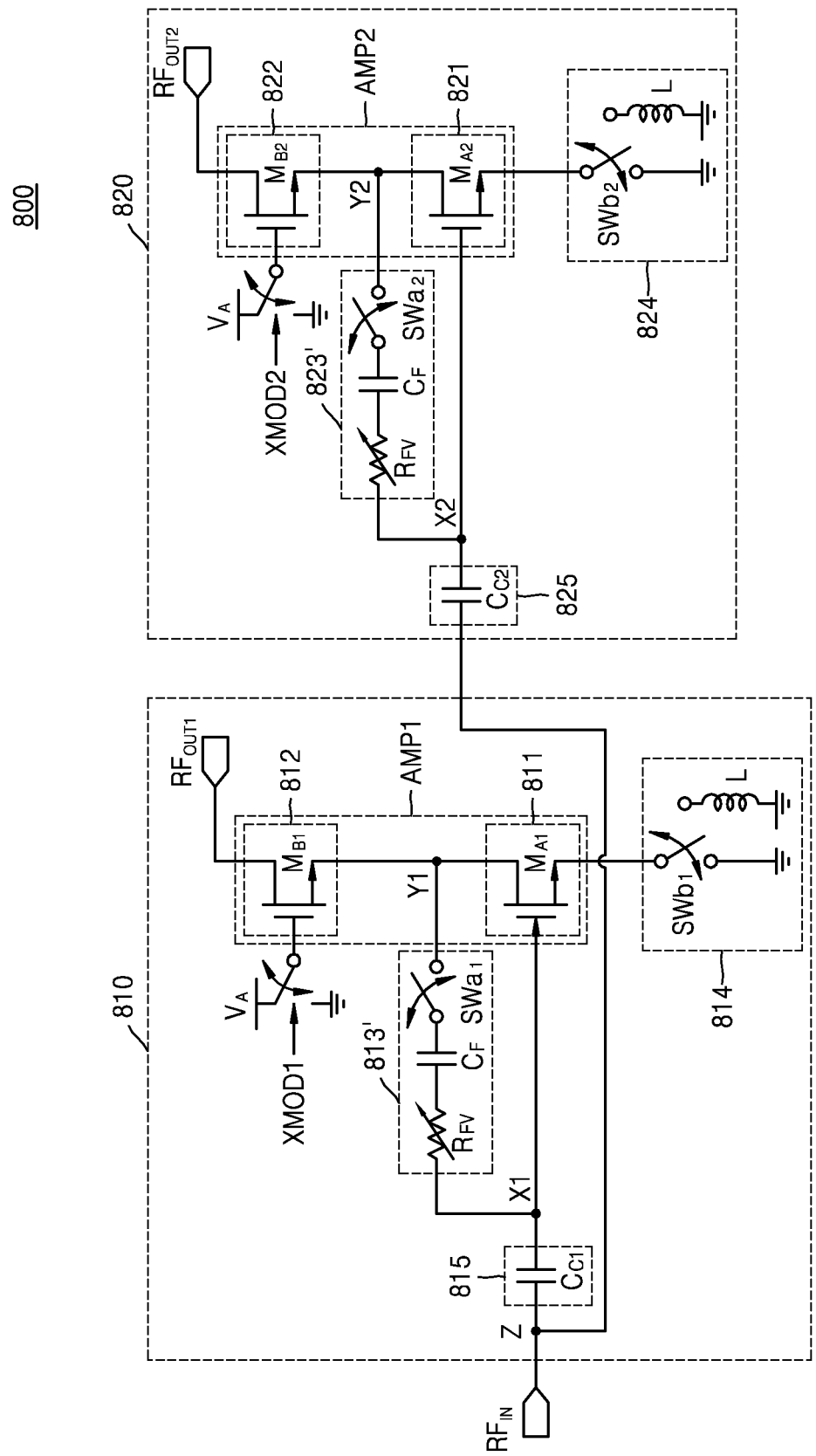

FIGS. 12A and 12B are block diagrams illustrating embodiments of a plurality of amplifier circuits included in the amplification blocks 331a_1 to 331a_n of FIG. 6A, which are compatible with various interface circuits.

Referring to FIG. 12A, the first amplifier circuit 810 further includes a first ground connection circuit 814 having a switching element SWb1 and an inductor L as compared with the first amplifier circuit 810 of FIG. 11A. The first amplifier circuit 810 includes a first feedback circuit 813' that further includes a switch element SWa as compared to the first amplifier circuit 810 of FIG. 11A. The second amplifier circuit 820 further includes a second ground connection circuit 824 having a switch element SWb2 and an inductor L as compared with the second amplifier circuit 820 of FIG. 11A.

In an embodiment, when the amplification block 800 is coupled to the antenna interface circuit 320a of FIG. 5A, a mode of the amplification block 800 is determined to be in a wideband mode, the switch element SWa1 is closed, and switch elements SWb1 and SWb2 are connected to ground (or potentials). When the amplification block 800 is connected to the antenna interface circuit 320b of FIG. 5B, the mode of the amplification block 800 is determined to be a narrow band mode, the switch element SWa is opened, and switch elements SWb1 and SWb2 are connected to terminals of inductors L whose other terminals are connected to ground terminals, respectively.

Referring to FIG. 12B, the first amplifier circuit 810 further includes a first ground connection circuit 814 having a switching element SWb1 and an inductor L, as compared to the first amplifier circuit 810 of FIG. 11A. The first amplifier circuit 810 includes a first feedback circuit 813' that furthers include a switch element SWa1 as compared to the first amplifier circuit 810 of FIG. 11A. The second amplifier circuit 820 further includes a second ground connection circuit 824 having a switch element SWb2 and an inductor L, as compared with the second amplifier circuit 820 of FIG. 11A. The second amplifier circuit 820 includes a second feedback circuit 823' that further includes a switch element SWa2 as compared to the second amplifier circuit 820 of FIG. 11B.

In an embodiment, when the amplification block 800 is coupled to the antenna interface circuit 320a of FIG. 5A, the mode of the amplification block 800 is determined to be a wideband mode, switch elements SWa1 and the SWa2 are closed, and switch elements SWb1 and SWb2 are connected to the ground terminal. When the amplification block 800 is connected to the antenna interface circuit 320b of FIG. 5B, the mode of the amplification block 800 is determined to be the narrowband mode, and the switch elements SWa1 and SWa2 are opened, and the switch elements SWb1 and SWb2 are connected to terminals of inductors L whose other terminals are connected to ground terminals, respectively.

Figure 13:
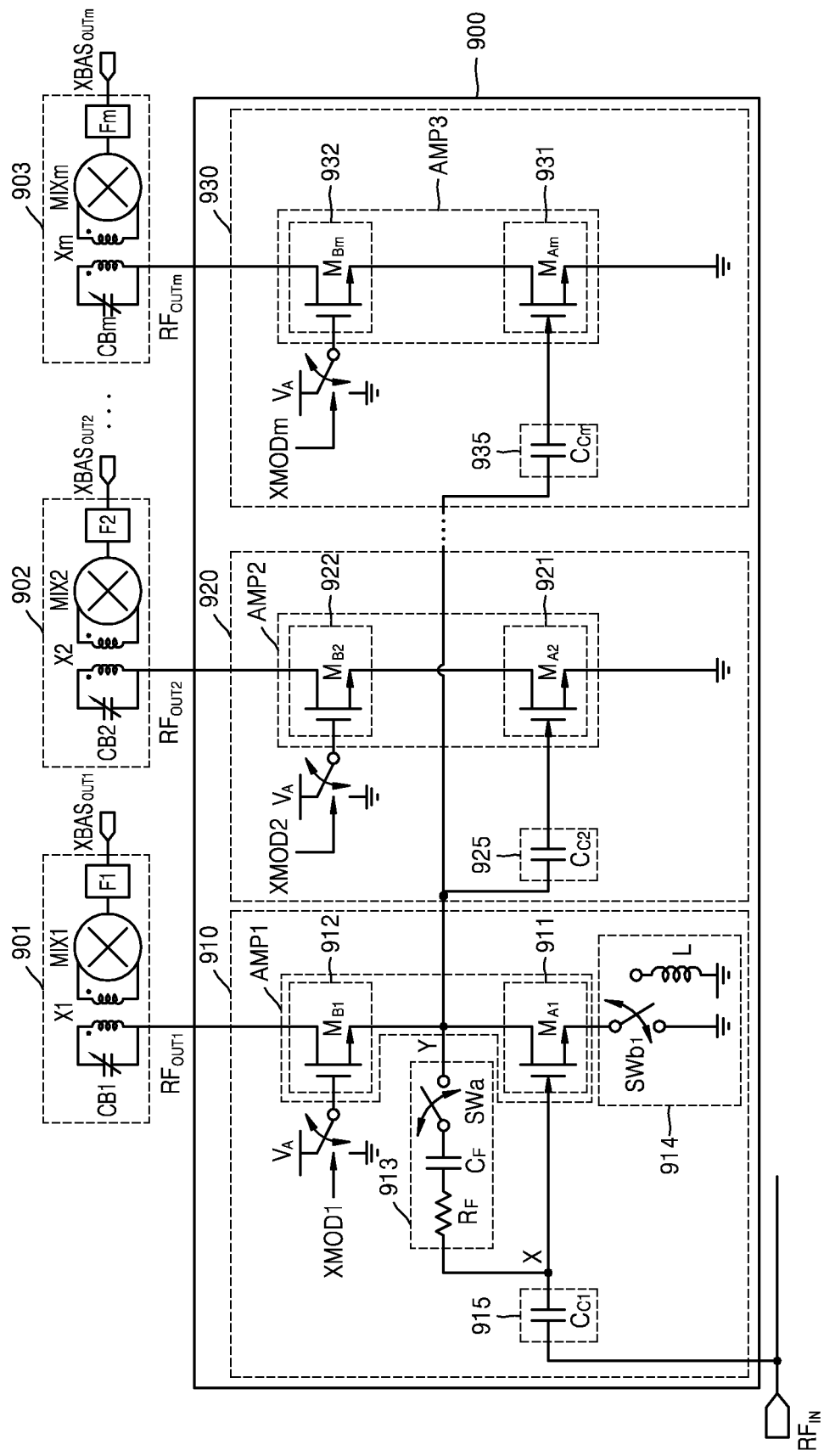
FIG. 13 is a diagram for explaining an amplification block according to an embodiment of the inventive concept.
Figure 14A:
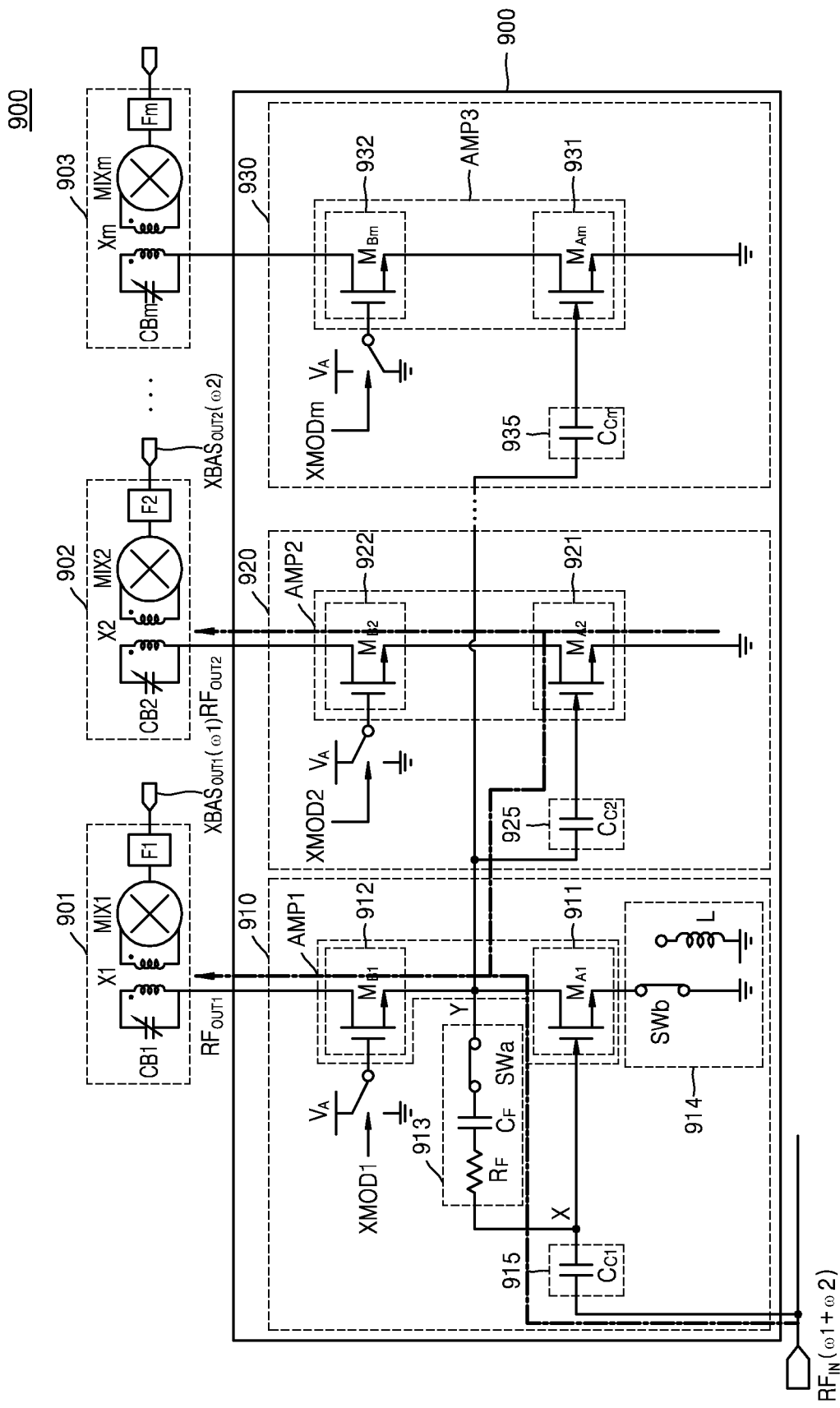
FIG. 14A is a view for explaining an operation in the wide band mode of the amplification block.
Figure 14B:
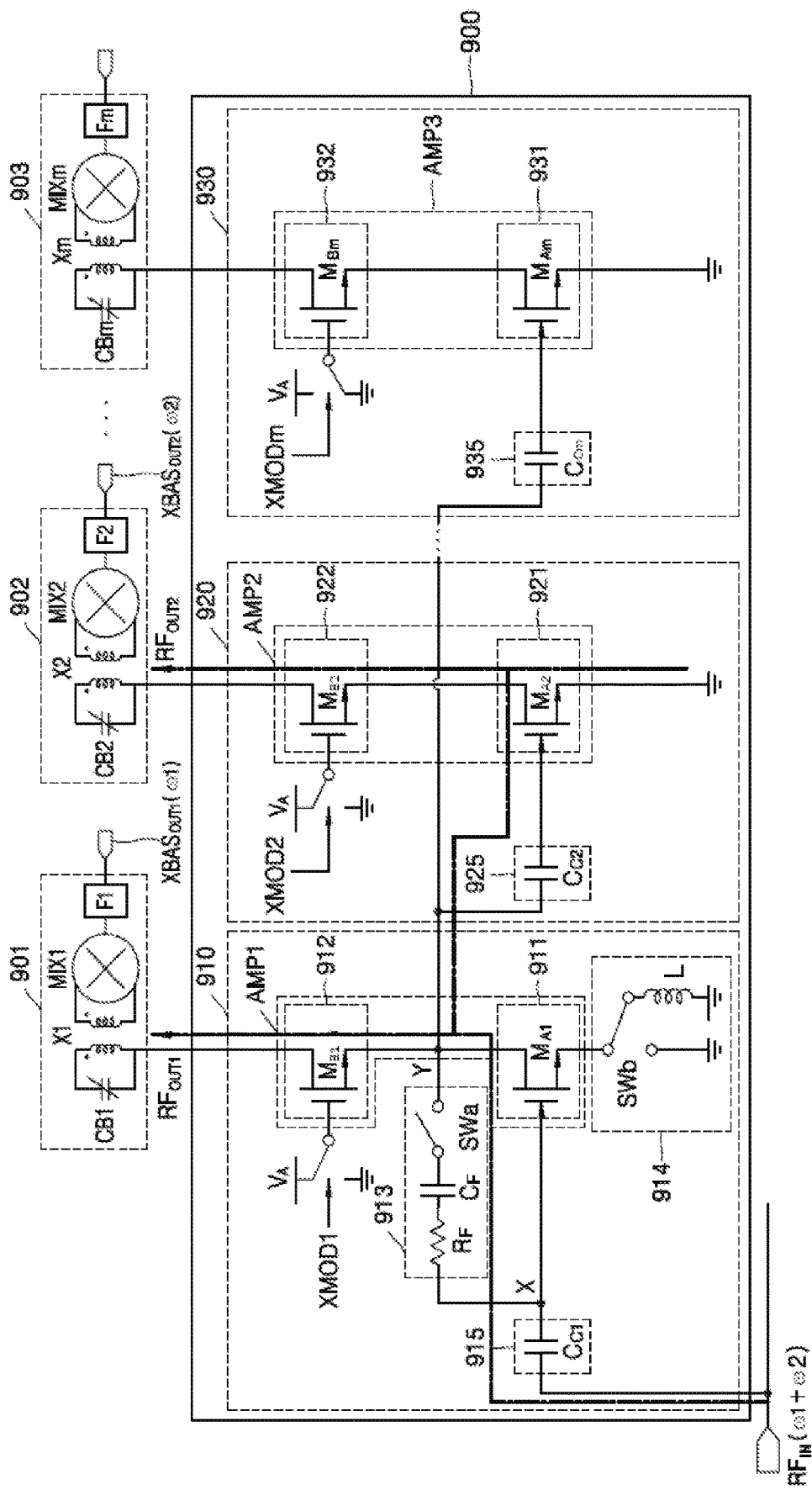
FIG. 14B is a diagram for explaining an operation of a amplification block in a narrowband mode.

FIG. 13 is a diagram for explaining an amplification block 900 according to an exemplary embodiment of the inventive concept, FIG. 14A is a diagram for explaining an operation in the wide band mode of the amplification block 900, and FIG. 14B is a diagram for explaining an operation in the narrowband mode of the amplification block 900.

Referring to FIG. 13, the amplification block 900 include M amplifier circuits 910 to 930, and M output circuits 901 to 903 are connected to the amplification block 900. A first amplifier circuit 910 includes a first amplifier AMP1, a feedback circuit 913, a ground connection circuit 914 and a coupling capacitor 915. The feedback circuit 913 includes a resistance element $R_F$, a capacitor element $C_F$ and a switch element SWa. The feedback circuit 913 is connected between an internal amplification node Y of a first amplifier AMP1 and an input node X of the first amplifier AMP1. The ground connection circuit 914 includes a switch element SWb and an inductor L having one terminal that is grounded. The first amplifier AMP1 includes a first transistor 911 and a second transistor 912.

The second to m-th amplifier circuits 920 to 930 are connected in parallel via the internal amplification node Y. Details of the amplifier circuits 910 to 930 are as described above and will be omitted hereinafter. The second amplifier circuit 920 includes a second amplifier AMP2 and a coupling capacitor 925. The second amplifier AMP2 includes a first transistor 921 and a second transistor 922. The third amplifier circuit 930 includes a third amplifier AMP3 and a coupling capacitor 935. The third amplifier AMP3 includes a first transistor 931 and a second transistor 932.

A first output circuit 901 includes a first converter X1, a first capacitor bank CB1, a first mixer MIX1 and a first baseband filter F1. In an embodiment, the first converter X1 is a transformer. In an embodiment, the first output circuit 901 block signals other than signals corresponding to carriers having a predetermined frequency from a first RF output signal $RF_{OUT1}$ and downconverts signals corresponding to the carriers to output the downconverted signals as a first baseband signal $XBAS_{OUT1}$. A configuration of the first output circuit 901 may be applied to the second to m-th output circuits 902 to 903. For example, the first output circuit 901 may filter out components having frequencies outside the bands associated with the carriers.

FIGS. 14A and 14B illustrate an amplification operation of an amplification block 900 in an intraband CA. Referring to FIG. 14A, an amplification block 900 receives an RF input signal $RF_{IN}$ transmitted through a first carrier ω1 and a second carrier ω2 within a predetermined frequency band. In an embodiment, only the first amplifier circuit 910 and the second amplifier circuit 920 are enabled in the amplification block 900. A switch element SWa of the first amplifier circuit 910 is closed and a switch element SWb is connected to a ground potential (or terminal). As such, the enable feedback circuit 913 is connected between an internal amplification node Y of the first amplifier AMP1 of the first amplifier circuit 910 and an input node X of the first amplifier AMP1.

The first amplifier circuit 910 amplifies the RF input signal $RF_{IN}$ to output the amplified RF input signal as a first RF output signal $RF_{OUT1}$, and the second amplifier circuit 920 receives a signal whose RF input signal $RF_{IN}$ is amplified by a predetermined amplification gain from the internal amplification node Y and amplifies the signal to output the amplified signal as a second RF output signal $RF_{OUT2}$. In an embodiment, the first output circuit 901 converts only a signal corresponding to the first carrier wave ω1 from the first RF output signal $RF_{OUT1}$ as the first baseband signal $XBAS_{OUT1}$ to output the converted signal, and the second output circuit 902 converts only a signal corresponding to the second carrier wave ω2 from the second RF output signal $RF_{OUT2}$ as the second baseband signal $XBAS_{OUT2}$ to output the converted signal.

Referring to FIG. 14B, an amplification block 900 receives an RF input signal $RF_{IN}$ transmitted through a first carrier ω1 and a second carrier ω2 within a predetermined frequency band. In an embodiment, only the first amplifier circuit 910 and the second amplifier circuit 920 in the amplification block 900 are enabled. A switch element SWa of the first amplifier circuit 910 is opened and a switch element SWb is connected to one terminal of an inductor L whose other terminal is connected to ground. The feedback circuit 913 is not connected between the internal amplification node Y of the first amplifier AMP1 in the first amplifier circuit 910 and the input node X of the first amplifier AMP1. For example, the open switch element SWa prevents the feedback circuit 913 from being connected to the internal amplification node Y.

The first amplifier circuit 910 amplifies the RF input signal $RF_{IN}$ to output the amplified RF input signal as a first RF output signal $RF_{OUT1}$, and the second amplifier circuit 920 receives a signal in which an RF input signal $RF_{IN}$ is amplified by a predetermined amplification gain from the internal amplification node Y and amplifies the received signal to output the amplified signal as a second RF output signal $RF_{OUT2}$. In an embodiment, the first output circuit 901 converts only a signal corresponding to the first carrier wave ω1 from the first RF output signal $RF_{OUT1}$ as the first baseband signal $XBAS_{OUT1}$ to output the converted signal, and the second output circuit 902 converts only a signal corresponding to the second carrier wave ω2 from the second RF output signal $RF_{OUT2}$ as the second baseband signal $XBAS_{OUT2}$ to output the converted signal.

Figure 15:
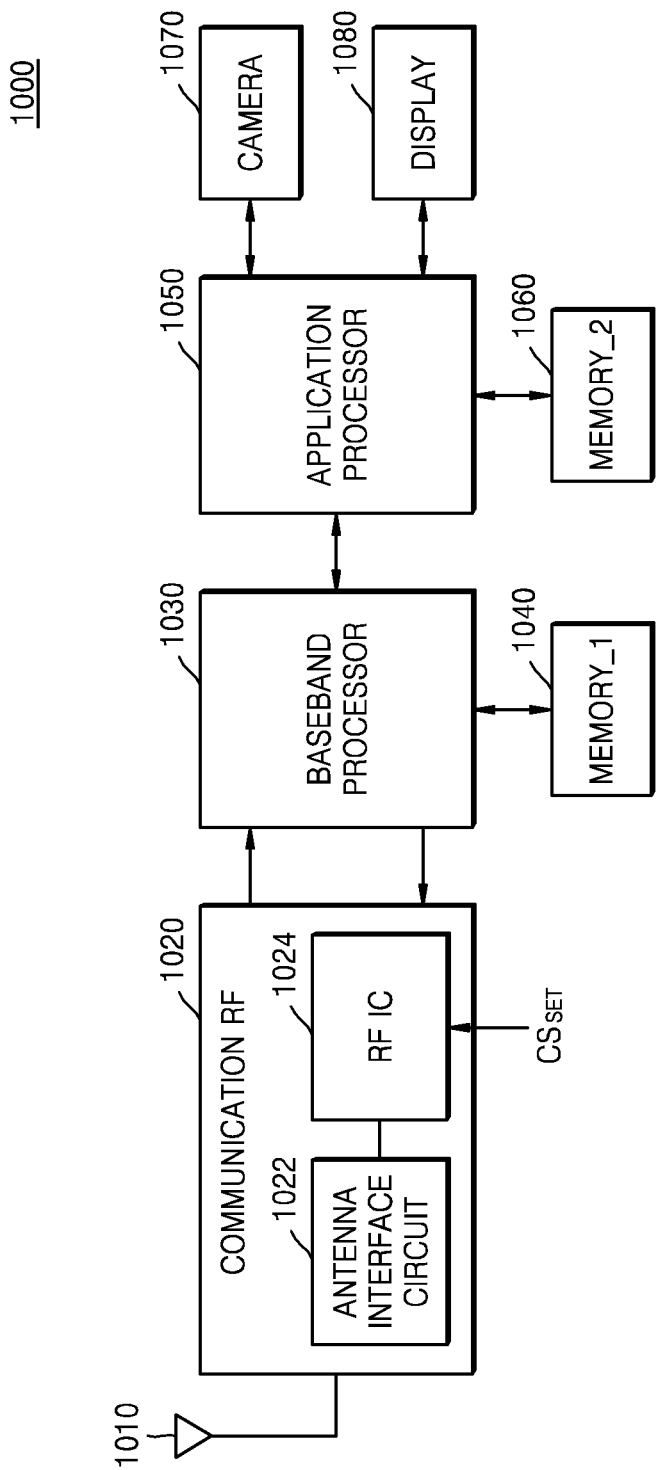
FIG. 15 is a diagram of a wireless communication device according to an exemplary embodiment of the inventive concept.

FIG. 15 is a diagram illustrating a wireless communication device 1000 according to an exemplary embodiment of the inventive concept.

Referring to FIG. 15, a wireless communication device 1000 includes an antenna 1010, a transceiver (or communication RF) 1020, a baseband processor 1030, an application processor 1050, memories 1040 and 1060, a camera 1070, and a display 1080. An application may be executed by the application processor 1050. For example, when an image is photographed through the camera 1070, the application processor 1050 may store the photographed image in a second memory 1060 to display it on the display 1080. The photographed image may be transmitted to the outside through a transceiver 1020 under a control of the baseband processor 1030. The baseband processor 1030 may temporarily store the photographed image in a first memory 1040 to transmit the photographed image. The baseband processor 1030 may also control communication for communication and data transmission/reception.

The transceiver 1020 includes an antenna interface circuit 1022 and an RF integrated circuit 1024. The RF integrated circuit 1024 may include the switching elements illustrated in FIGS. 8C, 10, 12A, 12B, together with a feedback circuit, and the RF integrated circuit 1024 may be compatible with the antenna interface circuit 1022 having various circuit configuration. The transceiver 102 may perform an efficient amplification operation during a CA operation. In a step of manufacturing the transceiver (or receiver) 1020, a mode of the RF integrated circuit 1024 may be determined according to a circuit configuration of the antenna interface circuit 1022. A control signal $CS_{SET}$ according to the determined mode may be supplied to the RF integrated circuit 1024. In an embodiment, on/off states of the switch elements included in the RF integrated circuit 1024 are controlled by the control signal $CS_{SET}$, and then the RF integrated circuit 1024 is connected to the antenna interface circuit 1022.

Figure 16:
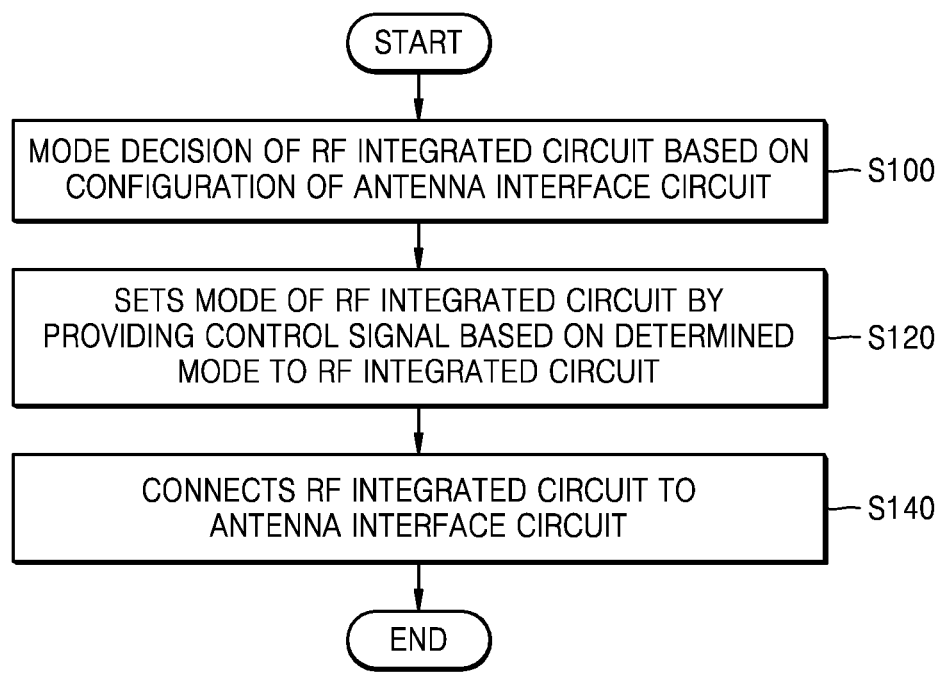
FIG. 16 is a flowchart illustrating a method of manufacturing a receiver, according to an exemplary embodiment of the inventive concept.

FIG. 16 is a flow chart illustrating a method of manufacturing a receiver according to an exemplary embodiment of the inventive concept. Hereinafter, it is assumed that an RF integrated circuit is manufactured in a configuration including switch elements, as illustrated in FIGS. 8C, 10, 12A, and 12B.

Referring to FIG. 16, in a step S100, a mode of the RF integrated circuit is determined based on a configuration of the antenna interface circuit. For example, when the RF integrated circuit is connected to the antenna interface circuit 320a of FIG. 5A, the mode of the RF integrated circuit is determined as the wideband mode. In addition, when the RF integrated circuit is connected to the antenna interface circuit 320b of FIG. 5B, the mode of the RF integrated circuit is determined as the narrowband mode. Afterwards, in a step S120, a control signal according to the determined mode is provided to the RF integrated circuit to set the mode of the RF integrated circuit. That is, the switch elements included in the RF integrated circuit may be controlled based on a control signal such that the RF integrated circuit operates in the wide band mode or the narrowband mode. Thereafter, in a step S140, the antenna interface circuit is connected to the RF integrated circuit.

While the inventive concept has been described with reference to exemplary embodiments thereof, it is to be understood that the inventive concept is not limited to the disclosed exemplary embodiments, but, on the contrary, is intended to cover various modifications and equivalent arrangements included within the spirit and scope of the disclosure.

While the inventive concept has been particularly shown and described with reference to exemplary embodiments thereof, it will be understood that various changes in form and details may be made therein without departing from the spirit and scope of the disclosure.

What is claimed is:

1. A receiver comprising an amplification block supporting carrier aggregation (CA), the amplification block comprising:
a first amplifier circuit configured to receive a radio frequency (RF) input signal at a block node from an outside source, amplify the RF input signal, and output the amplified RF input signal as a first RF output signal, wherein the first amplifier circuit comprises:
a first amplifier configured to receive the RF input signal through a first input node to amplify the RF input signal;
a first feedback circuit coupled to the first input node and selectively connected to a first internal amplification node of the first amplifier based on a mode of the receiver to provide feedback to the first amplifier; and
a second amplifier circuit connected in series with the first amplification node,
wherein the first amplifier comprises:
a first transistor comprising a gate connected to the first input node; and
a second transistor comprising a drain connected to a first RF output node of the amplification circuit, wherein a source of the second transistor is coupled to a drain of the first transistor at the first internal amplification node,
wherein the second amplifier circuit comprises a second amplifier configured to amplify a signal received from the first internal amplification node through a second input node to output a second RF output signal.

2. The receiver of claim 1, Wherein the first feedback circuit has a specific impedance such that an input impedance of the amplification circuit is kept within a predetermined range when the amplification circuit performs an amplification operation according to any one of a non-CA, an intra-band CA, and an inter-band CA.

3. The receiver of claim 1, wherein the first feedback circuit comprises at least one resistance element and at least one capacitor element connected in series with the resistance element.

4. The receiver of claim 1, wherein the first transistor and the second transistor have different transconductances such that an amplification gain corresponding to the first internal amplification node has a predetermined value.

5. The receiver of claim 4, wherein an amplification gain of the first amplifier is different from an amplification gain of the second amplifier.

6. The receiver of claim 1, wherein the second amplifier comprises:
a third transistor comprising a gate coupled to the second input node; and
a fourth transistor comprising a drain coupled to a second RF output node of the amplification circuit, wherein a source of the fourth transistor is coupled to a drain of the third transistor.

7. The receiver of claim 6, wherein a transconductance ratio between the first transistor and the second transistor of the first amplifier is different from a transconductance ratio between the third transistor and the fourth transistor of the second amplifier.

8. The receiver of claim 1, wherein the first amplifier circuit further comprises a source degeneration inductor element configured to be selectively connected to a source of the first transistor based on the mode.

9. The receiver of claim 8,
wherein the source degeneration inductor element is configured to be connected to the source of the first transistor when the mode is a narrowband mode including an inter-band CA mode, and
wherein the source degeneration inductor element is configured to be disconnected from the source of the first transistor when the mode is a wideband mode including an intra-band CA mode.

10. The receiver of claim 1,
wherein the first feedback circuit is configured to be connected to the first internal amplification node when the mode is a wideband mode including and intra-band CA mode, and
wherein the first feedback circuit is configured to be disconnected from the first internal amplification node when the mode is a narrowband including an inter-band CA mode.

11. A radio frequency (RF) integrated circuit comprising an amplification circuit configured to support carrier aggregation (CA), the amplification circuit comprising:
p first amplifier circuit configured to receive an RF input signal at a block node from an outside source, the first amplifier circuit including a first amplifier configured to amplify the RF input, signal, and output the amplified RF input signal as a first output signal,
wherein the first amplifier circuit comprises a feedback circuit coupled between a first input node of the first amplifier configured to receive the RF input signal and a first internal amplification node of the first amplifier, and
wherein the feedback circuit provides feedback to the first amplifier in a wideband mode of the RF integrated circuit,
wherein the RF integrated circuit is set to the wideband mode when an antenna interface circuit comprising a plurality of switches, a plurality of duplexers and an external amplifier is connected to the RF integrated circuit via one port.

12. The RF integrated circuit of claim 11, wherein the feedback circuit comprises:
a switching element configured to be in an on state in teh wideband mode and in an off state in the narrowband mode;
at least one resistance element connected in series with the switching element; and
at least one capacitor element.

13. The RF integrated circuit of claim 11, wherein the first amplifier circuit further comprises a ground connection circuit configured to be selectively connected to one terminal of a source degeneration inductor element whose other terminal is grounded according to the mode.

14. The RF integrated circuit of claim 11,
wherein the feedback circuit is disabled in a narrowband mode of the RF integrated circuit,
wherein the RF integrated circuit is set to the narrowband mode when an antenna interface circuit comprising a plurality of duplexers is connected to the RF integrated circuit via a plurality of ports.

15. A method of controlling a receiver, the method comprising:
determining an operation mode of the receiver to be one of a narrowband mode and a wideband mode based on a configuration of an antenna interface circuit;
setting a first control signal according to the determined mode;
outputting the first control signal to the receiver to selectively perform one of an enabling and disabling a feedback circuit of the receiver; and
connecting the receiver to the antenna interface circuit,
wherein the receiver comprises an amplifier configured to receive a radio frequency (RF) input signal through an input node and amplify the received the RF input signal, and
wherein the feedback circuit is connected between the input node and an internal amplification node of the amplifier to provide feedback to the amplifier,
wherein the feedback circuit is configured to be enabled in a wideband mode including an intra-band CA mode and disabled in a narrowband mode including an inter-band CA mode.

* * * * *